(12) United States Patent
Imamura et al.

(10) Patent No.: US 9,689,938 B2
(45) Date of Patent: Jun. 27, 2017

(54) GRADIENT MAGNETIC FIELD COIL DEVICE, ADJUSTMENT METHOD THEREFOR, AND MAGNETIC RESONANCE IMAGING APPARATUS

(75) Inventors: Yukinobu Imamura, Tokyo (JP); Mitsushi Abe, Tokyo (JP); Takeshi Yatsuo, Kashiwa (JP); Masanao Terada, Tokyo (JP); Ryuya Ando, Tokyo (JP); Takeshi Kawamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 647 days.

(21) Appl. No.: 14/239,872

(22) PCT Filed: Aug. 10, 2012

(86) PCT No.: PCT/JP2012/070558
§ 371 (c)(1),
(2), (4) Date: Feb. 20, 2014

(87) PCT Pub. No.: WO2013/035494
PCT Pub. Date: Mar. 14, 2013

(65) Prior Publication Data
US 2014/0176138 A1    Jun. 26, 2014

(30) Foreign Application Priority Data

Sep. 5, 2011 (JP) .................................. 2011-192780

(51) Int. Cl.
*G01R 33/34* (2006.01)
*G01R 33/421* (2006.01)
*G01R 33/565* (2006.01)

(52) U.S. Cl.
CPC . *G01R 33/34092* (2013.01); *G01R 33/34007* (2013.01); *G01R 33/4215* (2013.01); *G01R 33/56518* (2013.01); *Y10T 29/49117* (2015.01)

(58) Field of Classification Search
CPC ........ G01R 33/34092; G01R 33/34007; G01R 33/4215; G01R 33/56518; Y10T 29/49117
See application file for complete search history.

(56) References Cited

U.S. PATENT DOCUMENTS

| | | | | |
|---|---|---|---|---|
| 5,083,085 A | * | 1/1992 | Morad | G01R 33/421 324/318 |
| 5,406,205 A | * | 4/1995 | Muller | G01R 33/385 324/318 |
| 2007/0090841 A1 | * | 4/2007 | Evans | G01R 33/4215 324/318 |

FOREIGN PATENT DOCUMENTS

| | | |
|---|---|---|
| JP | 3-289938 A | 12/1991 |
| JP | 6-189931 A | 7/1994 |

(Continued)

*Primary Examiner* — G. M. Hyder
(74) *Attorney, Agent, or Firm* — Mattingly & Malur, PC

(57) ABSTRACT

In a gradient magnetic field coil device including: a plurality of main coils generating in an imaging region of a magnetic field resonance imaging device a magnetic field distribution in which an intensity linearly inclines; and a plurality of shield coils, arranged on an opposite side of the imaging region across the main coils, suppressing residual magnetic field generated by the main coils on the opposite side. The plurality of main coils and the plurality of shield coils are connected in series. The device further includes a plurality of current adjusting devices, connected to the shield coils in parallel, independently adjusting currents flowing through the shield coils, respectively, to enhance symmetry of the residual magnetic field. The gradient magnetic field coil device is provided which can suppress generation of eddy current magnetic field even if there is a relative position deviation between the main coils and shield coils.

18 Claims, 13 Drawing Sheets

(56) References Cited

FOREIGN PATENT DOCUMENTS

| JP | 7-163540 A | 6/1995 |
| JP | 7-178069 A | 7/1995 |
| JP | 2004-130052 A | 4/2004 |

* cited by examiner

GRADIENT MAGNETIC FIELD COIL DEVICE, ADJUSTMENT METHOD THEREFOR, AND MAGNETIC RESONANCE IMAGING APPARATUS

TECHNICAL FIELD

The present invention relates to a gradient magnetic field coil device for generating a gradient magnetic field distribution, an adjustment method therefor, and a magnetic resonance imaging apparatus including the gradient magnetic field coil device.

BACKGROUND ART

A magnetic resonance imaging (MRI: Magnetic Resonance Imaging) apparatus is an apparatus for obtaining a tomographic image representing physical and chemical characteristics of a target body using a nuclear magnetic resonance phenomenon occurring when high frequency pulses are applied to the target body placed in a homogeneous static magnetic field, and particularly used as a medical use. The MRI apparatus mainly includes a magnet device for generating a homogeneous static magnetic field in an imaging region into which the object body is inserted, a gradient magnetic field coil device for generating a pulsed gradient magnetic field (gradient magnetic field distribution) of which intensity is specially inclined to apply positional information to the imaging region, an RF coil causing nuclear magnetic resonance phenomenon by radiating the high frequency pulses toward the object body, a receiving coil for receiving magnetic resonance signal from the object body, and a computer system for displaying a tomographic image through processing the received magnetic resonance signal.

Means for enhancing a performance of the MRI apparatus is provided by enhancing a static magnetic field intensity generated by the magnet device. The larger the static magnetic field intensity, the clearer and the more various tomographic images can be obtained, so that development is continued to have the higher static magnetic field intensity. Another means for enhancing a performance is provided by increasing the intensity of the gradient magnetic field and the gradient magnetic field pulses are driven at a high speed. These contribute toward shortening photographing time period and increase in an image quality and used by a high speed photographing method which has been used frequently in recent years. The high speed photographing method is enabled by a high speed switching and supply of a large current intensity, which are provided by an enhanced performance of a drive power source for the gradient magnetic field coil device.

Because pulsed currents flow in the gradient magnetic field coil device to generate pulsed gradient magnetic field, eddy currents are generated at a metal container part of the magnet device by the pulsed gradient magnetic field (residual magnetic field), so that the magnetic field by the eddy currents influence the tomographic image. Accordingly, the gradient magnetic field coil device includes the main coil for generating the gradient magnetic field in the imaging region, and a shield coil to prevent the pulsed gradient magnetic field (residual magnetic field) from leaking to an unnecessary part other than the imaging region. The shield coil reduces the residual magnetic field to suppress generation of eddy currents at the metal container part of the magnet device.

To suppress the generation of the eddy currents, it is necessary to manufacture the main coil and the shield coil in accordance with the intended design. In the actual manufacturing the main coil and the shield coil, spiral shapes are formed by cutting an electrical conductive material such as metal plates, in a saddle shape by a bending process. An insulation material of a resin is filled in a gap between multi-layers of the main and shield coils and hardened and fixed to each other. During a plurality of such manufacturing processes, a manufacturing error due to a slight difference from a configuration intended in designing may occur. When the manufacturing error is small, the residual magnetic field is low, so that the eddy currents generated at the metal container part are also low. Accordingly, eddy current magnetic field generated in the imaging region by the eddy currents is also low without influence on the tomographic image. However, when the manufacturing error becomes large, influence on the image by the eddy current becomes non-negligible.

Accordingly, to accurately manufacture the gradient magnetic field coil device, there is a proposed technology in which metal plates are shaped in a spiral shape by cutting process while the metal plates are being fixed on a pedestal having a curved plane (see, for example, Patent document 1). Further, there is another proposed technology in which generation of the eddy currents is reduced by increasing flow path resistances of the eddy currents by providing slits in the metal container part of the magnet apparatus.

PRIOR ART

Patent Document

PATENT DOCUMENT 1: JP2004-130052

SUMMARY OF INVENTION

Problem to be Solved by Invention

A market of the MRI apparatuses is requesting to provide a sharp image at a high speed. For this reason, the gradient magnetic field coil device is required to generate the gradient magnetic field having a magnetic flux density as large as the situation allows. As the result, the gradient magnetic field coil is supplied with a large current of pulses varying at a high speed. Because the gradient magnetic field having a large intensity by a large current, the residual magnetic field also becomes large. Further, because the magnetic field variation quantity also increases by supplying the pulse current at the high speed, a magnetic field variation quantity of the residual magnetic field also increases, so that the eddy currents generated in the metal container of the magnet device becomes also large, the eddy current magnetic field generated by the eddy currents also becomes large. When the eddy current magnetic field becomes large, there may be a case where the tomographic image is deteriorated.

There is another request in the market of the MRI apparatus to make the space into which the object body is introduced as board as the situation allows. In addition, there is a request on a side of examination to make a photographing region as broader as the situation allows. Accordingly the gradient magnetic field coil device, installed between the space for the object body and the magnet device, is required to have a structure having a volume made as small as the situation allows. More specifically, a gap between the main coil and the shield coil of the gradient magnetic field coil device tends to be narrower, so that the manufacturing accuracy (allowed manufacturing error) required for the gap becomes hard.

According to these requests, there is necessity to make the eddy current magnetic field small in intensity under the circumstance in which a manufacturing accuracy request becomes hard. Accordingly, in the manufacturing process of the gradient magnetic field coil device, a magnetic field is measured in a positioning process of the main coil and the shield coil, and the residual magnetic field is made minimum by finely adjusting relative positions. After this, the resin is filled in a gap between them and hardened to fix the main coil and the shield coil. However, when the fine adjustment is insufficient, or when a deviation in relative positions of the main coil and the shield coil occurs during hardening, the eddy currents generated in the metal container of the magnet device becomes large, and the eddy current magnetic field generated by the eddy currant also becomes large. Accordingly, the tomographic mage will be deteriorated and the apparatus cannot provide the performance as intended in designing. However, in that case, it is not economic manner to spend long time for the fine adjustment and the positional deviation during hardening is unavoidable. Accordingly, even if the position deviation generated to some extent is permitted, it is useful, as long as generation of the eddy current magnetic field can be suppressed.

The problem to be solved by the present invention is to provide a gradient magnetic field coil device, an adjustment method therefor, and a magnetic resonance imaging apparatus which can suppress generation of the eddy current magnetic field even if there is a relative deviation between the main coil and the shield coil.

Means for Solving Problem

To solve the problem, the present invention provides a gradient magnetic field coil device characterized in that a plurality of current adjusting devices, connected in parallel to a plurality of shield coils (second coils) or a plurality of main coils (first coil), for independently adjusting currents flowing through the second coil or the first coil.

Further, the present invention provides a magnetic resonance imaging apparatus including: the gradient magnetic field coil device and the magnet device, disposed on an opposite side of the imaging region across the second coil, generating a static magnetic field in the imaging region.

Further, the present invention provides an adjustment method for the gradient magnetic field coil device in which symmetry of the residual magnetic field can be enhanced by adjusting the currents flowing through the plurality of the second control by the plurality of the current adjusting devices.

Advantageous Effect of Invention

According to the present invention, even if there is a relative positional deviation between the main coil (first coil) and the shield coil (second coil), the present invention provides a gradient magnetic field coil device, an adjustment method therefor and a magnetic resonance imaging apparatus capable of suppressing generation of the eddy current magnetic field.

MODES FOR CARRYING OUT INVENTION

Next, embodiments of the present invention are described in detail with reference to drawing. In each figure, the common parts are designated with the same references, and duplicated descriptions are omitted.

First Embodiment

Figure 2:
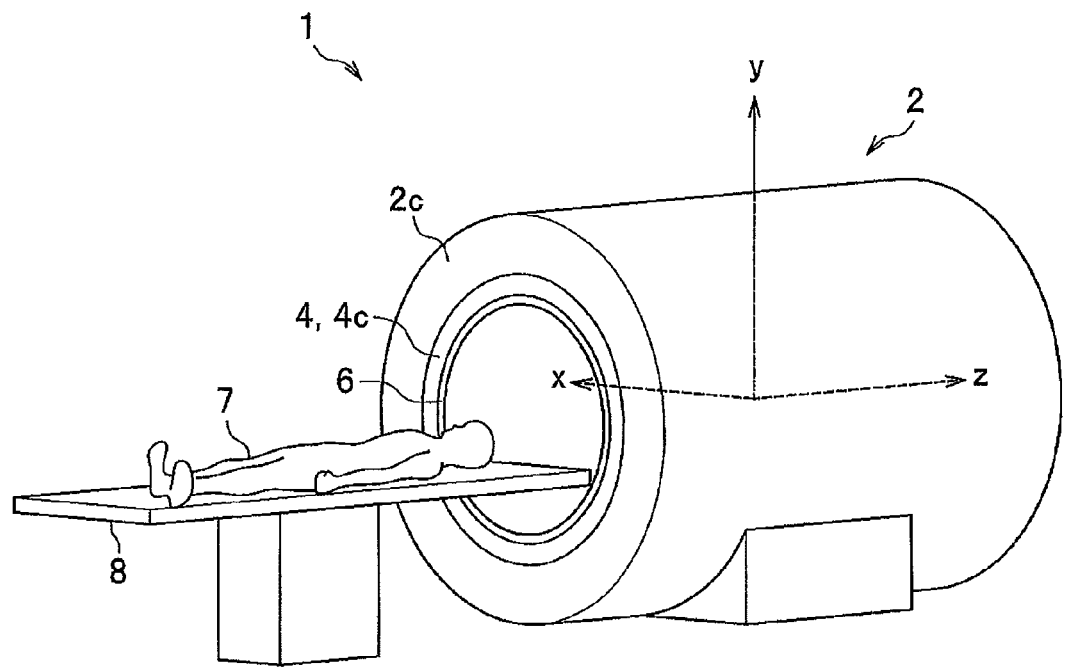
FIG. 2 is a perspective view of an MRI (magnetic resonance imaging) apparatus including a gradient magnetic field coil device according to the first embodiment of the present invention.

FIG. 2 shows a perspective view of an MRI (magnetic resonance imaging) apparatus 1 including a gradient magnetic field coil device 4 according to the first embodiment of the present invention. The MRI apparatus 1 substantially has triple hollow cylindrical shapes. Outside the triple hollow cylindrical shapes, a vacuum vessel 2c is installed which has a hollow cylindrical shape configuring a magnet device 2. Provided inside the vacuum vessel 2c is a gradient magnetic field coil device 4 having a hollow cylindrical shape. The gradient magnetic field coil device 4 is covered with a resin 4c. Provided inside of the gradient magnetic field coil device 4 is an RF coil 6 having a hollow cylindrical shape. An object body (patient) 7 is inserted into a space inside the RF coil 6 in a state where the object body is lying on a moving bed 8. Center axes of the triple hollow cylindrical shapes of the vacuum vessel 2c, the gradient magnetic field coil device 4, and the RF coil 6 substantially agree and set to a horizontal direction. To make a later explanation easier, a z axis is set to agree with the center axes. A y axis is oriented upwardly in the vertical direction. An x axis is oriented in the horizontal direction. The origin of coordinates is set to an approximately center of the triple hollow cylindrical shapes of the vacuum vessel 2c, the gradient magnetic field coil device 4, and the RF coil 6.

Figure 3:
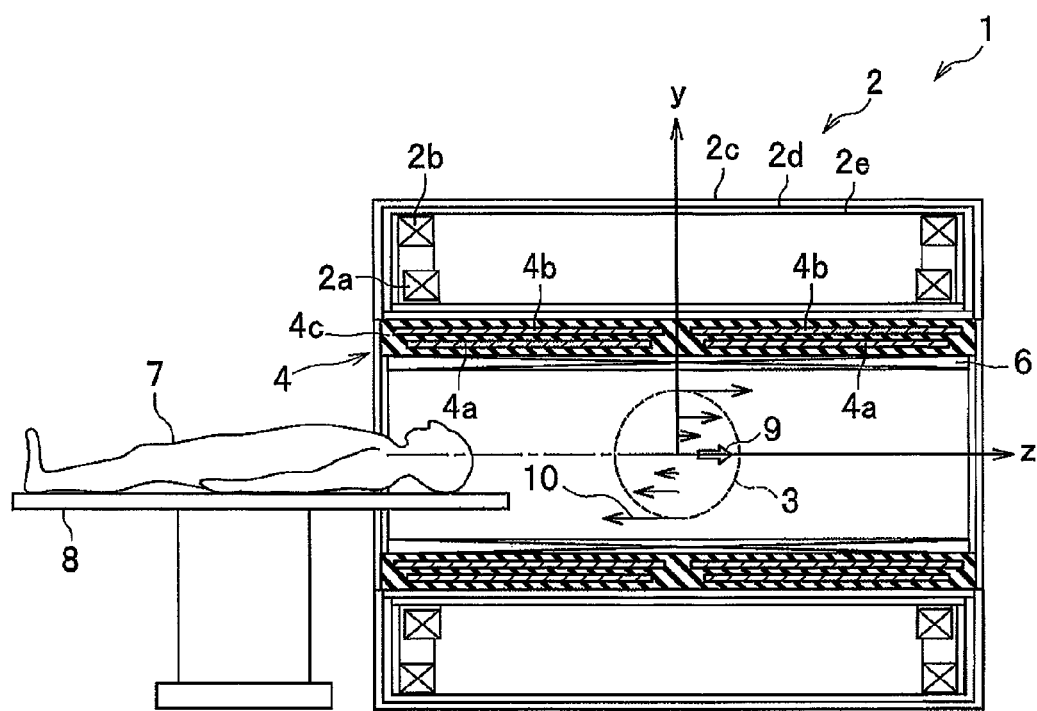
FIG. 3 is a cross section view of the MRI (magnetic resonance imaging) apparatus including the gradient magnetic field coil device cut away on a plane in parallel to the y axis and the z axis.

FIG. 3 illustrates a cross section view of the MRI (magnetic resonance imaging) apparatus 1 including the gradient magnetic field coil device 4 according to the first embodiment of the present invention cut away on a plane in parallel to the y axis and the z axis. A circumferential region of the origin of the coordinates is an imaging region 3. The MRI apparatus 1 is of a horizontal magnetic field type in which a direction of a static magnetic field 9 formed in the imaging region 3 is in the horizontal direction (z-axis direction). The object body (patient) 7 is moved to the imaging region 3, and a tomographic image is photographed. The magnet device 2 generates the static magnetic field 9 which is homogeneous in the imaging region 3. The gradient magnetic field coil device 4 generates Pulsed gradient magnetic field 10 of which magnetic field intensity is spatially inclined to provide positional information at the imaging region 3 (in the example in FIG. 3, the magnetic field intensity is inclined in the y axis direction). An RF coil 6 applies high frequency pulses to the object body 7. A receiving coil (not shown) receives a magnetic resonance signal from the object body 7. A computer system (not shown) processes the received magnetic resonance signal to display the tomographic image. According to the MRI apparatus 1, a tomographic image can be obtained, the tomographic image representing physical and chemical characteristics of a target body using a nuclear magnetic response phenomenon occurring when high frequency pulses are applied to the target body placed in a homogeneous static magnetic field, and particularly used as a medical use.

The magnet device 2 is provided with a main coil (superconducting coil) 2a for generating the static magnetic field 9 in the imaging region 3 and a shield coil (superconducting coil) 2b for suppressing leaking (residual magnetic field) to the circumference of the static magnetic field 9. These main coils 2a, 2b have torus shapes having center axes which are commonly on the z axis, respectively. An inner diameter of the shield coil 2b is larger than an outer diameter of the main coil 2a. It is frequent to use superconducting coils for these coils 2a, 2b. In that case, the coils 2a, 2b are housed in a container having a three-layer structure. The coils 2a, 2b are housed in a refrigerant vessel 2e together with a refrigerant of liquid helium (He). The refrigerant vessel 2e is enclosed by a radiation shield 2d for shielding a heat radiation toward an inside thereof. The vacuum vessel 2c, which is a hollow cylindrical container, houses the refrigerant vessel 2e and the radiation shield 2d and keeps the inside thereof in vacuum. Though the vacuum vessel 2c is installed in a room having a usual room temperature, because the inside of the vacuum vessel 2c is evacuated, the heat in the room does not transmit to the refrigerant vessel 2e by convection. Further, the radiation shield 2d suppresses transmission of heat in the room from the vacuum vessel 2c to the refrigerant vessel 2e. Accordingly, the coils 2a, 2b can be set at a cryogenic temperature, which is a temperature of the liquid helium, to function as superconducting magnets. For the refrigerant vessel 2e, the radiation shield 2d, and the vacuum vessel 2c, a non-magnetic material member is used to avoid generation of unnecessary magnetic field. Further, non-magnetic material, which can keep a vacuum state easily, is used. The refrigerant vessel 2e, the radiation shield 2d, and the vacuum vessel 2c are made as metal containers. Accordingly, at the refrigerant vessel 2e, and the radiation shield 2d, and particularly at the vacuum vessel 2c arranged at the most outer circumference are in such a sate that the eddy currents easily occur. The magnet device 2 is arranged on an opposite side of imaging region 3 across the gradient magnetic field coil device 4.

The gradient magnetic field coil device 4 generates the gradient magnetic field in the imaging region 3. The gradient magnetic field coil device 4 includes a plurality of main coils (first coils) 4a for generating a magnetic field distribution of which intensity linearly is inclined, a plurality of shield coils (second coils) 4b arranged on an opposite side of the imaging region 3 across the main coil 4a for suppressing the residual magnetic field made on the opposite side of the imaging region 3 by the main coil 4a. The resin 4c is filled between the main coil 4a and a shield coil 4b and hardened to bond the main coil 4a and the shield coil 4b to be fixed each other. The gradient magnetic field is magnetic field, of which magnetic flux density in the same direction as the static magnetic field 9, linearly inclined independently in three directions, i.e., the x axis, the y-axis, and the z-axis directions, and time is divided for generation of the magnetic field in each of three directions, i.e., the x axis, the y-axis, and z-axis directions, and the gradient magnetic fields are sequentially, repeatedly generated in three directions, i.e., the x axis, the y axis, and the z axis are generated in pulsate manner. More specifically, in FIG. 3, there is shown the gradient magnetic field 10 of which intensity is linearly inclined in the y direction.

Placed between the magnet device 2 and the gradient magnetic field coil device 4 are a plurality of small pieces of magnetic material called shim (not shown). With the shim the magnetic field intensity of the static magnetic field 9 generated within the imaging region 3 can be partially adjusted, which provides the imaging region 3 where the magnetic field intensity of the static magnetic field 9 is homogeneous.

Figure 4:
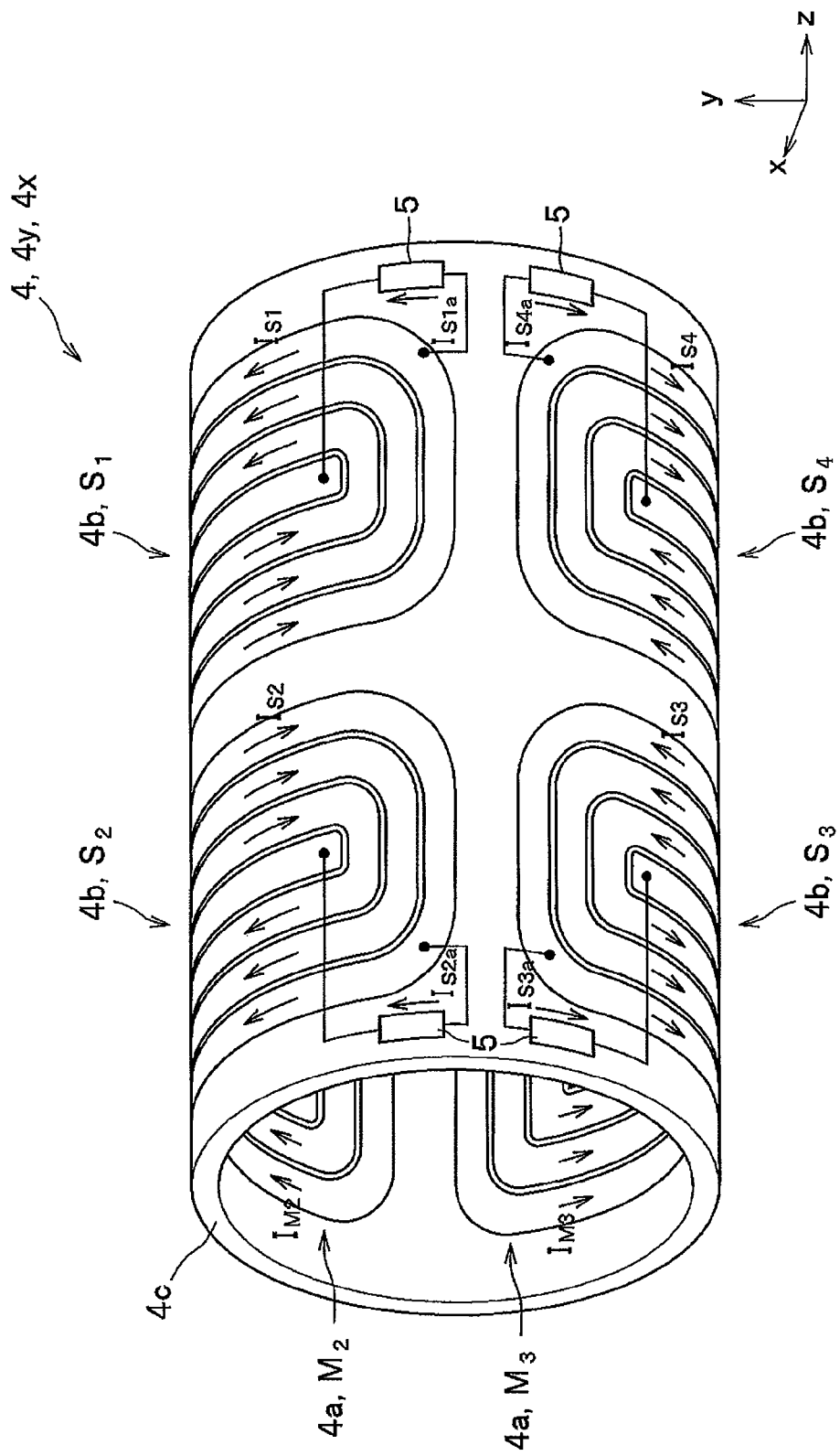
FIG. 4 is a perspective view of the gradient magnetic field coil device (gradient magnetic field coil device generating a gradient magnetic field inclined in the y-axis or the x-axis direction) according to the first embodiment of the present invention.
Figure 5:
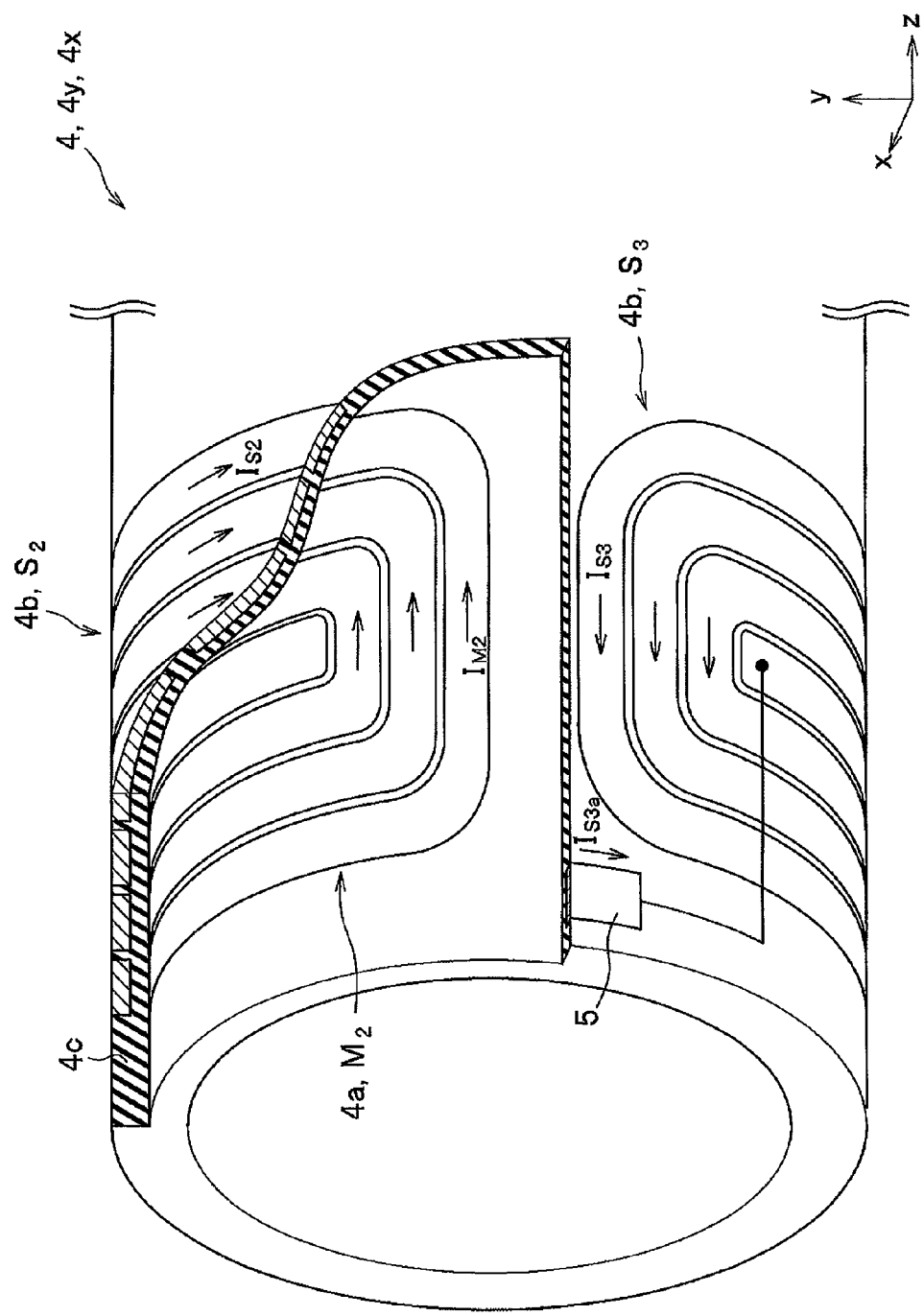
FIG. 5 is a partial perspective view illustrating a condition where a part of a layer having a shield coil is cut away at a part of the gradient magnetic field coil device (gradient magnetic field coil device generating a gradient magnetic field inclined in the y-axis direction or the x-axis direction) according to the first embodiment of the present invention.

FIG. 4 shows a perspective view of the gradient magnetic field coil device according to the first embodiment of the present invention. FIG. 5 shows a partial perspective view a state in which a part of layer including the shield coil 4b at a part of the gradient magnetic field coil device 4 is cut away. The gradient magnetic field coil device 4 includes a gradient magnetic field coil device 4y generating gradient magnetic field inclined in the y-axis direction, a gradient magnetic field coil device 4x generating gradient magnetic field inclined in the x-axis direction, and a gradient magnetic field 4z (see FIG. 6) for generating a gradient magnetic field inclined in the x-axis direction. In FIGS. 4 and 5, the gradient magnetic field coil devices 4x, 4z are omitted and only the gradient magnetic field coil device 4y is shown. The gradient magnetic field coil device 4x has basically such a structure that the gradient magnetic field coil device 4y is rotated by −90 degrees on the z axis, and the configuration thereof can be suspected easily, so that in FIG. 4, the reference "4x" of the gradient magnetic field coil device 4x is shown together with the reference "4y" of the gradient magnetic field coil device 4y. This is also true in FIGS. 1, 5, 7, 9, 10, 11, 12, and 15 described later. The invention carried out in the gradient magnetic field coil device 4y can be also carried out in the gradient magnetic field coil device 4x. This can be known by analogy with having a similarity relation therebetween. Accordingly, the gradient magnetic field coil device 4y is described below and description of the gradient magnetic field coil device 4x is omitted.

The gradient magnetic field coil device 4y (4) has a hollow cylindrical shape of which exterior is shaped with the resin 4c. On a side of an outer wall of the hollow cylindrical shape, the plurality (four in the example in FIG. 4) of shield coils (second coils) 4b ($S_1$, $S_2$, $S_3$, and $S_4$) having a spiral shape are embedded in the resin 4c. On a side of inner wall of the hollow cylindrical shape, a plurality (four in the example in FIG. 4) of the main coil (first coil) 4a ($M_1$ (not shown, see FIG. 1) having a spiral shape, $M_1$, $M_3$, and $M_4$ (not shown, see FIG. 1)) are embedded in the resin 4c. A shield coil $S_1$ (4b) and a main coil $M_1$ (4a, not shown) are bonded with the resin 4c filled therebetween to have a lamination structure. The shield coil $S_1$ (4b) is arranged to cover an outside of the main coil $M_1$ (4a, not shown) in parallel to the z axis around the z axis. A shield coil $S_2$ (4b) and a main coil $M_2$ (4a, not shown) are bonded with the resin 4c filled therebetween to have a lamination structure. The shield coil $S_2$ (4b) is arranged to cover an outside of the main coil $M_2$ (4a) in parallel to the z axis around the z axis. A shield coil $S_3$ (4b) and a main coil $M_3$ (4a) are bonded with the resin 4c filled therebetween to have a lamination structure. The shield coil $S_3$ (4b) is arranged to cover an outside of the main coil $M_3$ (4a) in parallel to the z axis around the z axis. A shield coil $S_4$ (4b) and a main coil $M_4$ (4a) are bonded with the resin 4c filled therebetween to have a lamination structure. The shield coil $S_4$ (4b) is arranged to cover an outside of the main coil $M_4$ (4a) in parallel to the z axis around the z axis.

As shown in FIG. 4, the shield coils 4b ($S_1$, $S_2$, $S_3$, $S_4$) having spiral shapes are connected to current adjusting devices, respectively. An end of the current adjusting device 5 is connected to an inside of the shield coil 4b ($S_1$, $S_1$, $S_1$, $S_4$) having spiral shape, and the other end is connected to an outside of the shield coil 4b ($S_1$, $S_2$, $S_3$, $S_4$) having spiral shapes. The current adjusting device 5 is connected to the shield coils 4b ($S_1$, $S_2$, $S_3$, $S_4$) having spiral shapes in parallel.

Pulsed currents $I_{M1}$ (not shown, see FIG. 1), $I_{M2}$, $I_{M3}$, $I_{M4}$ (not shown, see FIG. 1) flow through the main coil 4a ($M_1$ (not shown, see FIG. 1), $M_2$, $M_3$, $M_4$ (not shown, see FIG. 1), respectively. Pulsed currents $I_{S1}$, $I_{S2}$, $I_{S3}$, $I_{S4}$ flow through the shield coil 4b ($S_1$, $S_2$, $S_3$, $S_4$), respectively.

Causing the Pulsed current $I_{S1a}$ to flow through the current adjusting device 5 connected in parallel with the shield coil 4b ($S_1$), adjusts the Pulsed current $I_{S1}$ flowing in the shield coil 4b ($S_1$). Causing the Pulsed current $I_{S1a}$ to flow through the current adjusting device 5 connected to the shield coil 4b ($S_2$) in parallel, adjusts the Pulsed current $I_{S2}$ flowing in the shield coil 4b ($S_2$). Causing the Pulsed current $I_{S3a}$ to flow through the current adjusting device 5 connected to the shield coil 4b ($S_3$) in parallel, adjusts the Pulsed current $I_{S3}$ flowing in the shield coil 4b ($S_3$). Causing the Pulsed current $I_{S4a}$ to flow through the current adjusting device 5 connected to the shield coil 4b ($S_3$) in parallel, adjusts the Pulsed current $I_{S3}$ flowing in the shield coil 4b ($S_3$).

Figure 6:
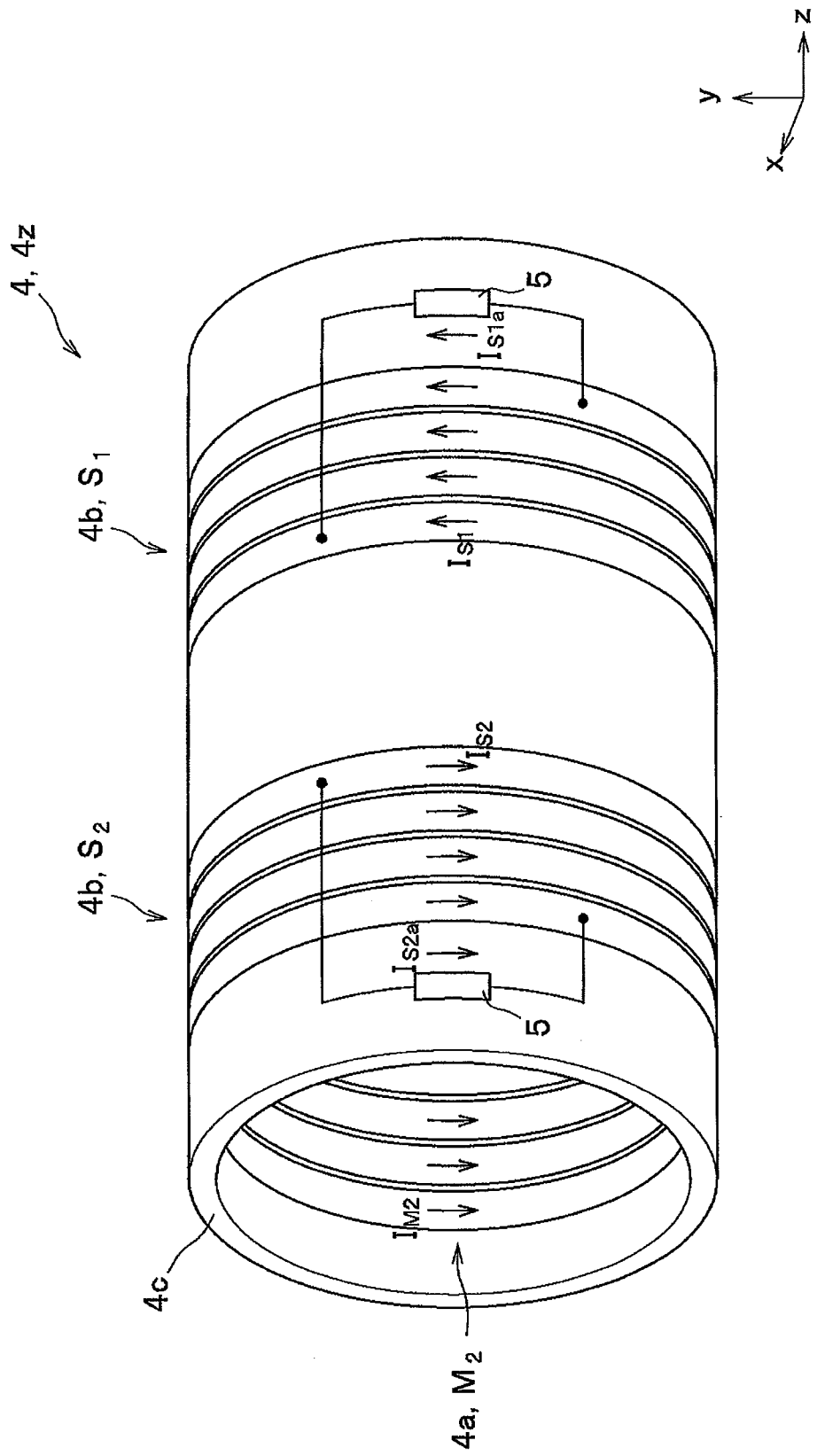
FIG. 6 is a perspective view of the gradient magnetic field coil device (gradient magnetic field coil device generating a gradient magnetic field inclined in the z-axis direction) according to the first embodiment of the present invention.

FIG. 6 shows a perspective view of the gradient magnetic field coil device 4 (gradient magnetic field coil device 4z generating a gradient magnetic field inclined in the z-axis direction) according to the first embodiment of the present invention. The gradient magnetic field 4z (4) has a hollow cylindrical shape of which exterior form is shaped with the resin 4c. On a side of an outer wall of the hollow cylindrical shape, the plurality (two in the example in FIG. 6) of shield coils (second coils) 4b ($S_1$, $S_2$) having a solenoid shape are embedded in the resin 4c. On a side of an inner wall of the hollow cylindrical shape, a plurality (two in the example in FIG. 6) of the main coils (first coil) 4a ($M_1$ (not shown, see FIG. 7) having a solenoid shape, $M_2$) having the solenoid shape are embedded in the resin 4c. The shield coil $S_1$ (4b) and a main coil $M_1$ (4a, not shown) are bonded with the resin 4c filled therebetween to have a lamination structure. The shield coil $S_1$ (4b) is arranged to cover an outside of the main coil $M_4$ (4a (not shown)) in parallel to the z axis and around the z axis. The shield coil $S_2$ (4b) and a main coil $M_2$ (4a) are bonded with the resin 4c filled therebetween to have a lamination structure. The shield coil $S_2$ (4b) is arranged to cover an outside of the main coil $M_2$ (4a) in parallel to the z axis and around the z axis.

The current adjusting devices 5 are connected to the shield coils 4b ($S_1$, $S_2$) having the solenoid shapes, respectively. One ends of the current adjusting devices 5 are connected to ends in the z-axis positive direction of the shield coil 4b ($S_1$, $S_2$) having solenoid shape, and the other ends are connected to ends in z-axis negative direction of the shield coils 4b ($S_1$, $S_2$) having solenoid shapes. The current adjusting devices 5 are connected to the shield coils 4b ($S_1$, $S_2$, $S_3$, $S_4$) having the solenoid shapes in parallel.

Pulsed currents $I_{M1}$ (not shown, see FIG. 7), $I_{M2}$ flow through the main coils 4a ($M_1$ (not shown, see FIG. 7), $M_2$), respectively. Pulsed currents $I_{S1}$, $I_{S2}$ flow through the shield coils 4b ($S_1$, $S_2$), respectively.

The Pulsed current $I_{S1}$ flowing through the shield coil $4b$ ($S_1$) can be adjusted by causing a Pulsed current $I_{S1a}$ to flow through the current adjusting device 5 connected to the shield coil $4b$ ($S_1$) in parallel. The Pulsed current $I_{S2}$ flowing through the shield coil $4b$ ($S_2$) can be adjusted by causing a Pulsed current $I_{S2a}$ to flow through the current adjusting device 5 connected to the shield coil $4b$ ($S_2$) in parallel.

As described above, the present invention carried out in the gradient magnetic field coil device $4y$ is applicable to the gradient magnetic field coil device $4z$ though the number of the main coil $4a$ and the shield coil $4b$ decreases by two. Because this can be easily understood by analogy, hereinafter, only the gradient magnetic field coil device $4y$ is described, and a description of the gradient magnetic field $4z$ is omitted.

Figure 1:
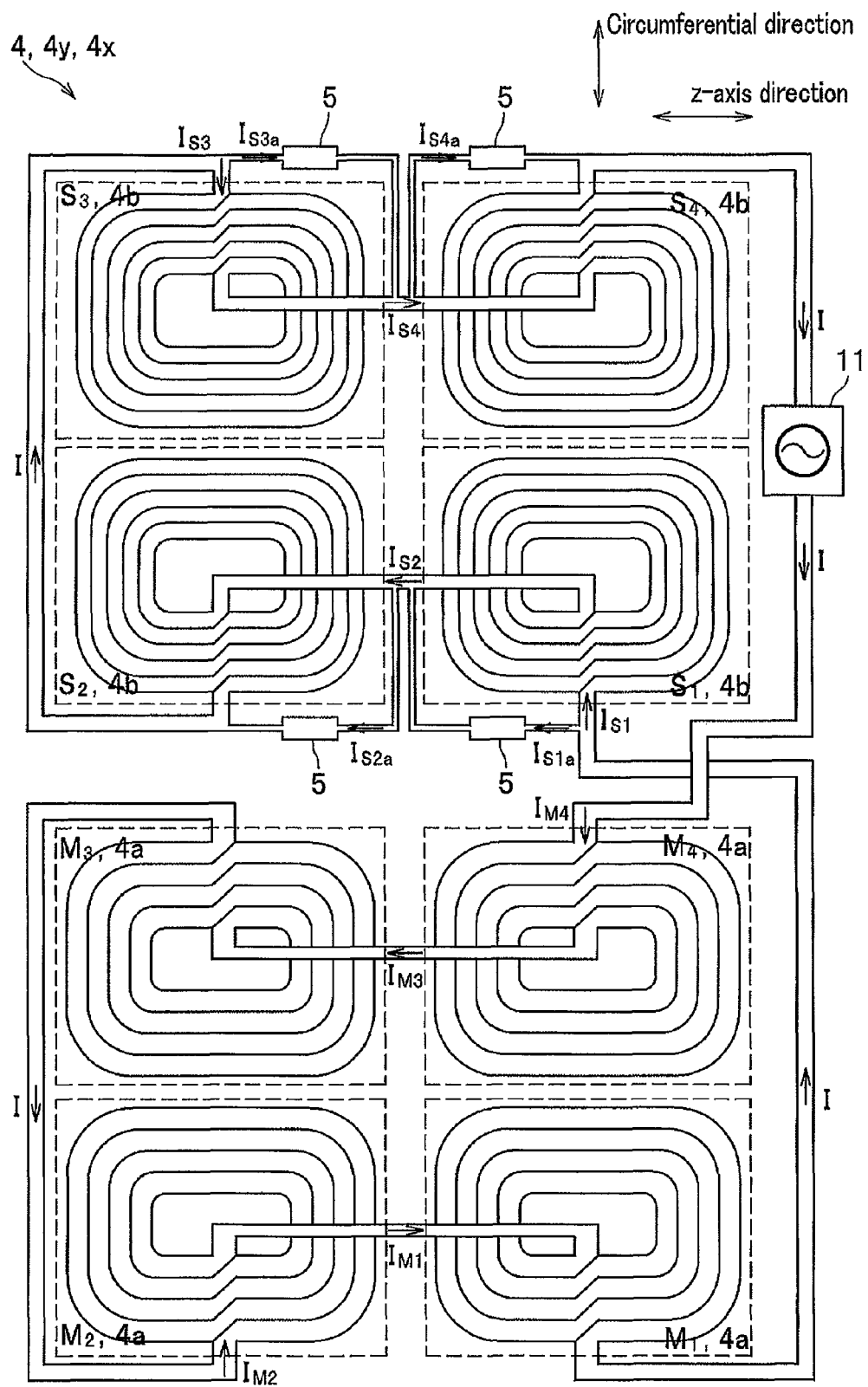
FIG. 1 is a developed view in which the main and shield coils of the gradient magnetic field coil device (gradient magnetic field coil device generating a gradient magnetic field inclined in a y-axis or an x-axis direction) according to a first embodiment of the invention are developed on a plane extending in a circumferential direction of a z axis.

FIG. 1 shows a developed view of the main coil $4a$ and the shield coil $4b$ of the gradient magnetic field coil device 4 (gradient magnetic field coil device $4y$ generating the gradient magnetic field inclined in the y-axis direction) according to a first embodiment of the invention on a plane extending in a circumferential direction of a z axis. Four main coils $M_1$, $M_2$, $M_3$, $M_4$ ($4a$) are connected in parallel. Four shield coils $S_1$, $S_2$, $S_3$, $S_4$ ($4a$) are connected in parallel. Four main coils $M_1$, $M_2$, $M_3$, $M_4$ ($4a$) and four shield coils $S_1$, $S_2$, $S_3$, $S_4$ ($4a$) are connected in series. The drive power source 11 for allowing the Pulsed current is connected to both ones ends of the drive power source 11.

According to this, the Pulsed currents $I_{M1}$, $I_{M2}$, $I_{M3}$, $I_{M4}$ flowing through four main coils $M_1$, $M_2$, $M_3$, $M_4$, respectively are equalized to currents I flowing from the drive power source 11 ($I_{M1}=I_{M2}=I_{M3}=I_{M4}$).

On the other hand, because the current adjusting devices 5 are connected to the four shield coils $S_1$, $S_2$, $S_3$, $S_4$ ($4a$) in parallel, respectively, currents $I_{S1a}$, $I_{S1a}$, $I_{S3a}$, $I_{S4a}$, which are parts of the current I outputted by the drive power source 11 can be divided into the current adjusting devices 5. Pulsed currents current $I_{S1}$, $I_{S2}$, $I_{S3}$, $I_{S4}$ flowing through the shield coils $S_1$, $S_2$, $S_3$, $S_4$ ($4a$) can be adjusted to be differentiated from each other ($I_{S1} \ne I_{S2} \ne I_{S3} \ne I_{S4}$). In addition it is possible to differentiates the Pulsed currents $I_{S1}$, $I_{S2}$, $I_{S3}$, $I_{S4}$ from the current I ($I_{S1}$, $I_{S2}$, $I_{S3}$, $I_{S4} \ne I$).

Figure 7:
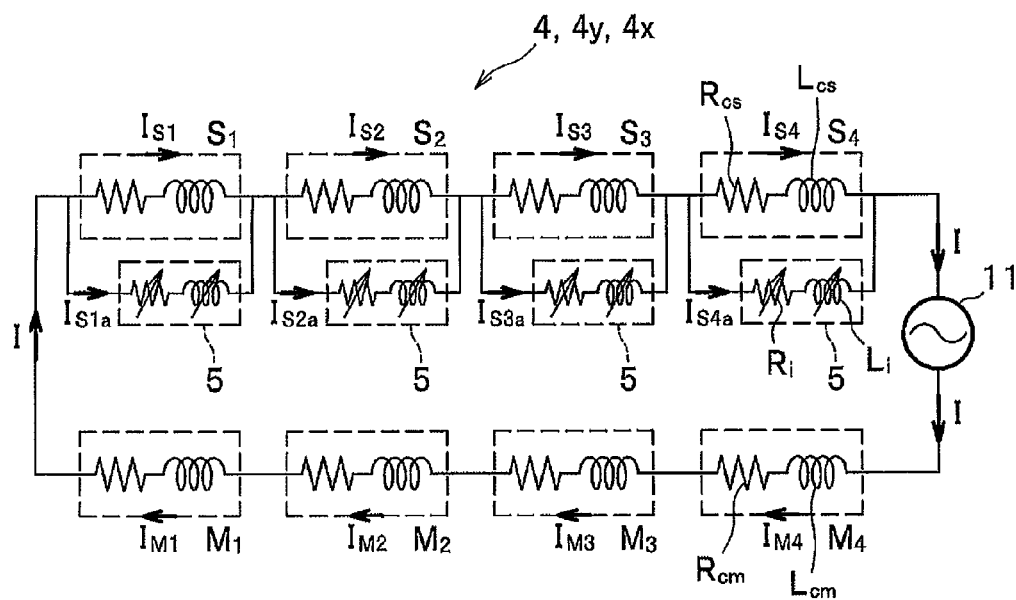
FIG. 7 is an equivalent circuit diagram of the gradient magnetic field coil device (gradient magnetic field coil device generating a gradient magnetic field inclined in the y-axis direction or the x-axis direction) according to the first embodiment of the present invention.

FIG. 7 shows an equivalent circuit diagram of the gradient magnetic field coil device 4 (gradient magnetic field coil device $4y$ generating a gradient magnetic field inclined in the y-axis direction) according to the first embodiment of the present invention. Four main coils $M_1$, $M_2$, $M_3$, $M_4$ ($4a$) can be described as serial connections including resistance components Rcm and inductance components Lcm, respectively. Four shield coils $S_1$, $S_2$, $S_3$, $S_4$ ($4a$) can be described as serial connections including resistance components Rcs and inductance components Lcs, respectively. The four current adjusting devices 5 can be described as serial connections including resistance components Ri and inductance components Li, respectively. The resistance component Ri can be varied in resistance value. The inductance component Li can be varied in inductance value. The resistance value of the resistance component Ri and the inductance value of the inductance components Li are varied for each of the shield coils $S_1$, $S_2$, $S_3$, $S_4$ ($4a$), so that currents $I_{S1a}$, $I_{S2a}$, $I_{S3a}$, $I_{S4a}$ are directly adjusted independently and currents $I_{S1}$, $I_{S2}$, $I_{S3}$, $I_{S4}$ are indirectly adjusted independently to enhance symmetry of the residual magnetic fields.

When the symmetry of the eddy current magnetic field in the imaging region 3 is high, influence of the eddy current magnetic field accompanied by the residual magnetic field can be weakened by controlling the current I of the drive power source 11 of the gradient magnetic field coil device 4 in photographing. Accordingly, in consideration of symmetry of the residual magnetic field which may be a cause of the eddy current magnetic field, the resistance values of the resistance components Ri and the inductance values of the inductance components Li of the four current adjusting devices 5 are adjusted. It is desirable to make adjustment so that the residual magnet field generated by four pairs in the gradient magnetic field coil device 4 ($4y$, $4x$) and two pairs in the gradient magnetic field coil device 4($4z$) of the residual magnetic fields (distributions) have symmetry (point symmetry (origin symmetry), line symmetry (x-axis symmetry, y-axis symmetry, z-axis symmetry), and plane symmetry (x-axis y-axis plane symmetry, y-axis z-axes plane symmetry, z-axis y-axis plane symmetry)). The four current adjusting devices 5 are independently controlled so that residual magnetic fields generated by each pair of the main coil $4a$ and the shield coil $4b$ are adjusted so that residual magnetic fields by four pairs in the gradient magnetic field coil device 4 ($4y$, $4x$) and two pairs in the gradient magnetic field coil device 4 ($4z$) have symmetry.

It is supposed that there are two methods to detect the symmetry of the residual magnetic field which may be a cause of the eddy current magnetic field, the first method measuring the eddy current magnetic field in the imaging region 3 (see FIG. 3) and the second method directly measuring the residual magnetic field outside the gradient magnetic field coil device 4. The former method is carried out in the magnet device 2 generating the eddy currents or an electric conductive member simulating a shape of the vacuum vessel $2c$ and the radiation shield $2d$ in the gradient magnetic field coil device 4. On the other hand, the latter method is carried out in a single unit of the gradient magnetic field coil device 4. In the both methods, measurements are made for the eddy current magnetic field or the residual magnetic field with a magnetic sensor such as a search coil or a Hall element, and the adjustments are made to have plane symmetry of the magnetic distributions with respect to a plane passing the center (origin), or point symmetry wherein a value is equivalent but sign is inverted.

For example, when the eddy current magnetic field in the imaging region 3 is measured, in a case where any one of the gradient magnetic field coil devices 4 for x-, y-, z-axes directions is power on, the eddy current magnetic fields at symmetrical locations, opposing across the origin, having equivalent distances to the origin are measured, the origin showing zero of the gradient magnetic field 10. For example, likewise the case of the y-axis direction gradient magnetic field the eddy current magnetic field generated by the gradient magnetic field 10 inclined in the y-axis direction is adjusted to have origin symmetry in which the eddy current magnetic fields at two points have the same absolute values, but the directions are opposite to the two points, opposing across the origin, having equivalent distance to the origin, located in positive and negative directions in the y axis regarding the origin. On the other hand, adjustment is made to have yz-plane symmetry or xy-plane symmetry in which eddy current magnetic fields at two points at same location in the y-axis direction, opposing across the origin, having the same distance from the origin in positive and negative direction of the x-axis or z-axis have the same orientation and same direction.

Figure 16:
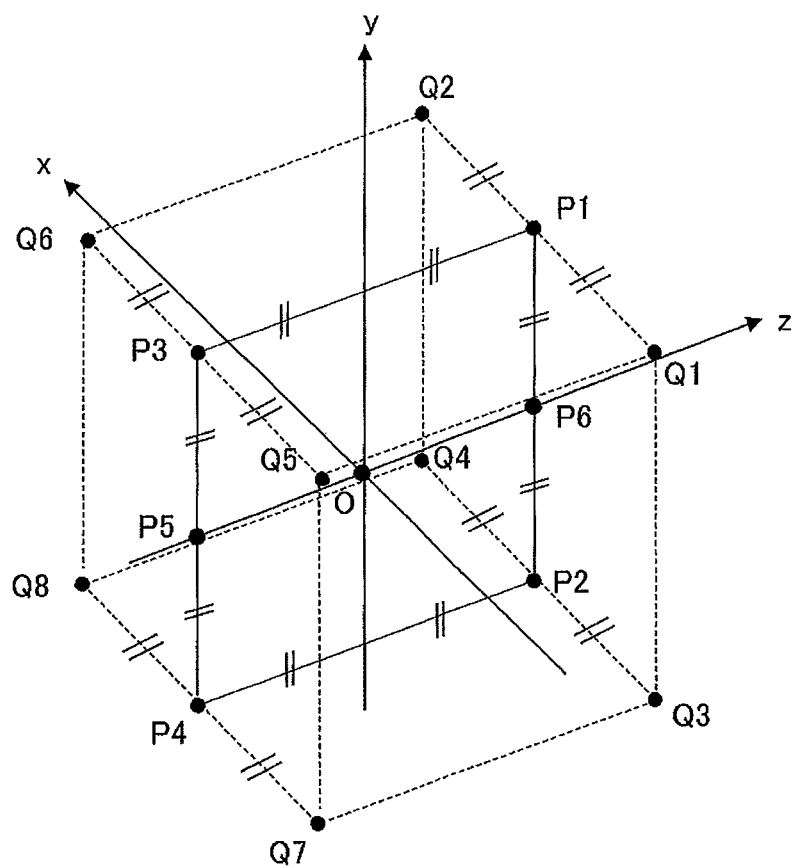
FIG. 16 is a perspective view illustrating magnetic field measuring points in a space where eddy current magnetic fields or residual magnetic fields of the gradient magnetic field coil device are measured for adjusting the current adjusting device according to the first embodiment of the present invention.

FIG. 16 shows magnetic field measuring points P1 to P6, Q1 to Q8 in a space where eddy current magnetic fields or residual magnetic fields of the gradient magnetic field coil device 4 are measured for adjusting the current adjusting device 5. The gradient magnetic field coil device $4y$ (4) generating the y-axis direction gradient magnetic field includes a pair of the main coil 4a and the shield coil 4b, and four of the current adjusting devices 5. Accordingly, eddy current magnetic fields at, for example, four magnetic field measuring points P1, P2, P3, P4 equidistance from the origin O as shown in FIG. 16 are measured, and the current adjusting devices 5 are adjusted so that the eddy current magnetic fields have the same intensity at all four points and directions of the eddy current magnetic fields at the measuring points P1 and P2 are opposite, and directions of the eddy current magnetic fields at the measuring points P3 and P4 are opposite. When the gradient magnetic field coil device 4x (4) generating the gradient magnetic field in the x direction is adjusted, the four points of the magnetic field measuring points P1, P2, P3, P4 are moved to locations having −90° rotation about the z axis, and after that, the eddy current magnetic fields are adjusted like the case of the gradient magnetic field coil device 4y. When the gradient magnetic field coil device 4z (4) generating the gradient magnetic field in the z direction is adjusted, because there are two pairs of the main coil 4a and the shield coil 4b and two current adjusting devices 5, the eddy current magnetic fields at measuring points P5, P6, opposing across the origin, being equidistant in the z axis from the origin O are measured, and the adjustment is made for the eddy current magnetic fields. In addition, to obtain the symmetry, for example, eight measuring points Q1 to Q8 shown in FIG. 16 can be used instead of the magnetic field measuring points P1 to P6. Accordingly, the gradient magnetic field coil devices 4 (4x, 4y, 4z) generating all gradient magnetic fields in the x-, y-, and z-axes direction can be adjusted at the same (common) magnetic field measuring points Q1 to Q8. In a case where the residual magnetic field of the gradient magnetic field coil device 4 is directly measured, similarly, points equidistant from the origin O can be used, but it is necessary to locate the measuring points outside an outer circumference of the gradient magnetic field coil device 4.

Figure 8:
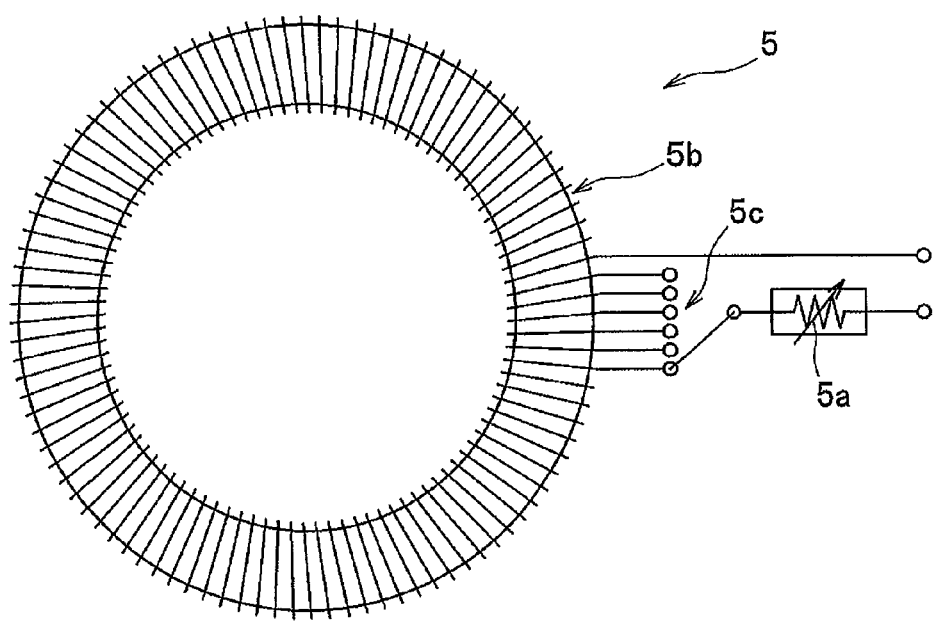
FIG. 8 is a circuit diagram of a current adjusting device used in the gradient magnetic field coil device according to the first embodiment of the present invention.

FIG. 8 illustrates a circuit diagram of the current adjusting device 5 used in the gradient magnetic field coil device 4 according to the first embodiment of the present invention. The current adjusting device 5 is configured with serial connections of a variable resistor 5a and a variable inductor 5b as described with a serial connection of the variable resistance component Ri and a variable inductance component Li shown in FIG. 7. It is preferable that the variable inductor 5b has a Rogowski shape. This can suppress influence on the tomographic image caused by generation of residual magnetic field generated by the variable inductor 5b. In the variable inductor 5b, the inductor component Li is adjusted, and in the variable resistor 5a, the resistance component Ri is adjusted. However, because the variable inductor 5b has a resistance component, when the variable inductor 5b is adjusted with a tap switch terminal 5c, the resistance component of the variable inductor 5b also varies. Using this, the variable inductor 5b can be used as the variable resistor 5a.

The currents $I_{S1a}$, $I_{S2a}$, $I_{S3a}$, $I_{S4a}$ flowing through the current adjusting device 5 can be generally adjusted within a range of ±0.1% from the currents $I_{S1}$, $I_{S2}$, $I_{S3}$, $I_{S4}$ flowing through the shield coil 4b, at maximum within a range ±0.5% (range being 1.0%). Further, the Pulsed currents $I_{S1a}$, $I_{S2a}$, $I_{S3a}$, $I_{S4a}$, $I_{S1}$, $I_{S2}$, $I_{S3}$, $I_{S4}$ each have periods in which transient current (alternate current) flow and periods in which a stationary current (dc current) flows.

In the period in which the stationary current (dc current) flows, a ratio between the resistance components Rcs and Ri determines ratios between currents $I_{S1a}$, $I_{S2a}$, $I_{S3a}$, $I_{S4a}$ and currents $I_{S1}$, $I_{S2}$, $I_{S3}$, $I_{S4}$. Because ratios between currents $I_{S1a}$, $I_{S2a}$, $I_{S3a}$, $I_{S4a}$ and currents $I_{S1}$, $I_{S2}$, $I_{S3}$, $I_{S4}$ are caused to be adjusted within 1.0% (width 1.0%), the resistance component Ri is set to a value which is hundred times the resistance component Rcs at most. Because a resistance component Rcs is generally equal to or smaller than 0.1 ohms, a resistance component Ri is set in a range of about 10 ohms at most. A heating value at the variable resistor 5a by the resistance component Ri is suppressed within 1% of the heating value at the shield coil $S_1$, $S_2$, $S_3$, $S_4$ (4a).

In a period in which transition currents (ac current) flow, a ratio between an inductance component Lcs and an inductance component Li determines ratios between the currents $I_{S1a}$, $I_{S2a}$, $I_{S3a}$, $I_{S4a}$ and the currents $I_{S1}$, $I_{S2}$, $I_{S3}$, $I_{S4}$. Because the ratios between the currents $I_{S1a}$, $I_{S2a}$, $I_{S3a}$, $I_{S4a}$ and the currents $I_{S1}$, $I_{S2}$, $I_{S3}$, $I_{S4}$ are caused to be adjusted within 1.0% (width of 1.0%), the resistance component Li is set to values which are hundred times the inductance component Lcs at most. Because the inductance component Lcs is generally about 100 µH, the inductance component Li is set within a range of about 10 mH at most. Voltages between both ends of the shield coils $S_1$, $S_2$, $S_3$, $S_4$ (4a) when transition currents flows, reach 1 kV at most. Setting the inductance component Li within a range of about 10 mH at most can prevent excessive currents from flowing through the current adjusting device 5. Because the current flowing through the current adjusting device 5 is about several amperes at most, the variable inductor 5b can be provided by increasing the number of turns per a unit length using a thin wire having a cross section of several mm².

In addition, because the transition current is generally a ramp wave, and thus a current time variation rate of the transition current is constant, a ratio between the resistance component Ri and the resistance component Rcs is approximately equalized to a ratio between the inductance component Li and the inductance component Lcs, which can make ratios between the currents $I_{S1a}$, $I_{S2a}$, $I_{S3a}$, $I_{S4a}$ and currents $I_{S1}$, $I_{S2}$, $I_{S3}$, $I_{S4}$ approximately constant.

In the current adjusting device 5, a resistance value of the resistance component Ri and an inductance value of the inductance component Li can be changed from an outside of the gradient magnetic field coil device 4. More specifically, the variable resistor 5a and the tap switch terminal 5c are exposed from the resin 4c. The adjustment of the current adjusting device 5 is carried out in a state in which the gradient magnetic field coil device 4 is inserted into the magnet device 2 by making the eddy current magnetic field generated by the eddy current generated upon power supplying to the gradient magnetic field coil device 4 origin symmetry in the imaging region 3. Accordingly, the current adjusting device 5 may be embedded or not embedded in the resin 4c. When the current adjusting device 5 is not embedded in the resin 4c, terminals become necessary to draw leads from the shield coil 4b outside the resin 4c. However, this provides a more free design than the case wherein a configuration for cooling the current adjusting device 5 generating heat because of power supply thereto is installed inside the resin 4c.

Figure 17:
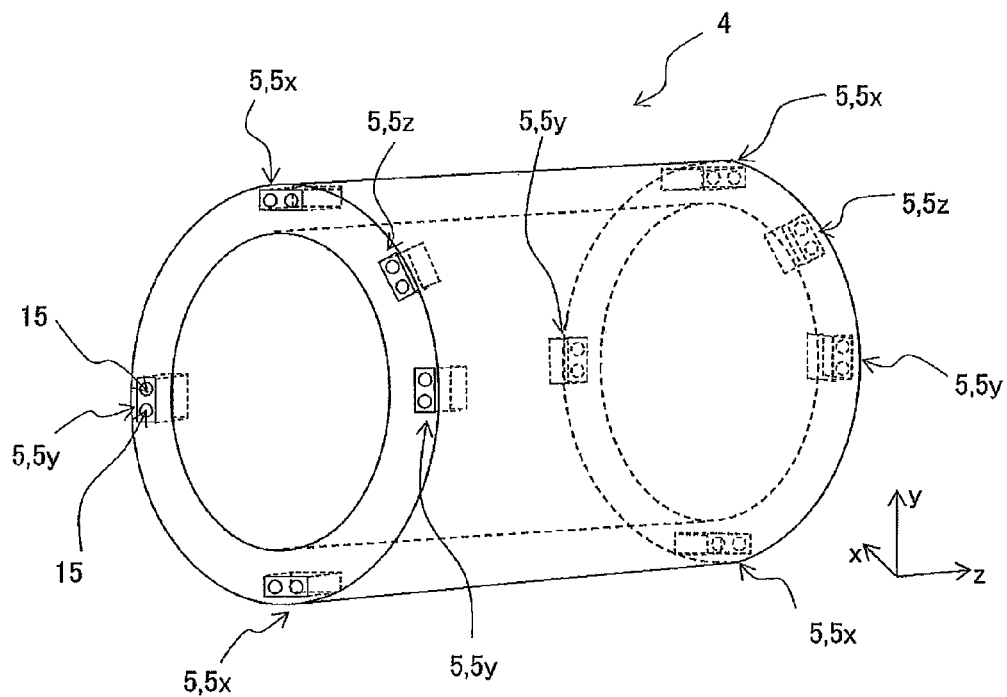
FIG. 17 is a perspective view of the gradient magnetic field coil device according to the first embodiment of the present invention.

FIG. 17 shows an example in which the adjustment of the current adjusting device 5 is made from an outside the gradient magnetic field coil device 4. After the gradient magnetic field coil device 4 is installed in the magnet device 2 (see FIG. 2), if it is assumed that installing locations of the current adjusting device 5 are determined at an inner diameter surface of the gradient magnetic field coil device 4 substantially having the hollow cylindrical shape or ends in the center axis direction (z-axis direction). This makes the adjustment easier irrespective of the gap between the magnet device 2 and the gradient magnetic field coil device 4. However, an inner diameter side of the gradient magnetic field coil device easily receives influence of a gradient magnetic field by the main coil 4a and is not a most adequate location to make the space for the object body 7 large. Then, as shown in FIG. 17, it is desirable that the current adjusting device 5x for the gradient magnetic field coil device 4x is installed at an end in the y-axis direction and at an end in the z-axis direction. Further, it is desirable that the current adjusting device 5y for the gradient magnetic field coil device 4y is installed at an end in the x-axis direction and at an end in the z-axis direction. In addition, it is possible to exchange the installation locations between the current adjusting device 5x and the current adjusting device 5y. In other words, the current adjusting devices 5x and 5y are installed at ends of the current adjusting device 5 in an inclination direction in which the magnetic field intensity of the gradient magnetic field 10, or at ends in a direction orthogonal with the inclination direction of the current adjusting device 5. According to these configurations makes it possible to install the current adjusting devices 5x, 5y, 5z in gaps between the main coils 4a forming the gradient magnetic field coil devices 4x, 4y in the x- and y-axes direction, or in gaps between the shield coils 4b (more specifically, between $S_2$ and $S_3$). In addition, installation can be carried out without narrowing the space for the object body 7, and operators, etc., can all the current adjusting devices 5 through knob for trimming, or terminal 15. Further, in FIG. 17, a current adjusting device 5z for the gradient magnetic field 4z in the z-axis direction is installed between current adjusting devices 5x, 5y. However, the locations are not limited to this, but it is also possible to install the current adjusting device 5z is arranged close to the current adjusting devices 5x or 5y and between the main coils 4a or between the shield coils 4b, which forms the gradient magnetic field coil devices 4x, 4y in x- and y-axes directions. Further, the knobs for trimming or terminal 15s installed in the current adjusting devices 5x, 5y, 5z correspond to the tap switch terminal 5c for the variable inductor 5b and a knob for the variable resistor 5a for the current adjusting device 5 shown in FIG. 8.

Second Embodiment

Figure 9:
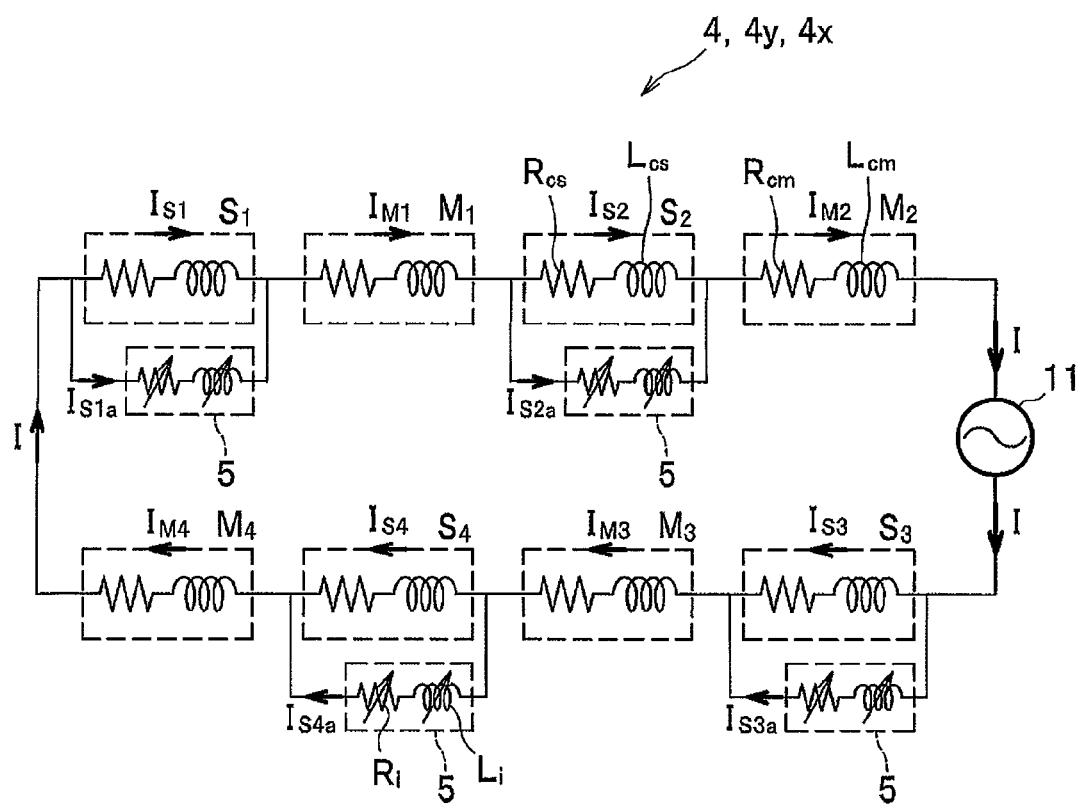
FIG. 9 is an equivalent circuit diagram of a gradient magnetic field coil device (gradient magnetic field coil device generating a gradient magnetic field inclined in the y-axis direction or the x-axis direction) according to a second embodiment of the present invention.

FIG. 9 illustrates an equivalent circuit diagram of a gradient magnetic field coil device 4 (gradient magnetic field coil device 4y generating a gradient magnetic field inclined in the y-axis direction) according to a second embodiment of the present invention. The second embodiment is different from the first embodiment in that the main coils $M_1$, $M_2$, $M_3$, $M_4$ and the shield coil $S_1$, $S_2$, $S_3$, $S_4$ are alternately connected one by one. According to this, the four main coils $M_1$, $M_2$, $M_3$, $M_4$ and the four shield coils $S_1$, $S_2$, $S_3$, $S_4$ are connected in series. This can simplify a structure for keeping withstand voltages because the voltage difference in the gradient magnetic field coil device 4 (4y) can be made small.

Third Embodiment

Figure 10:
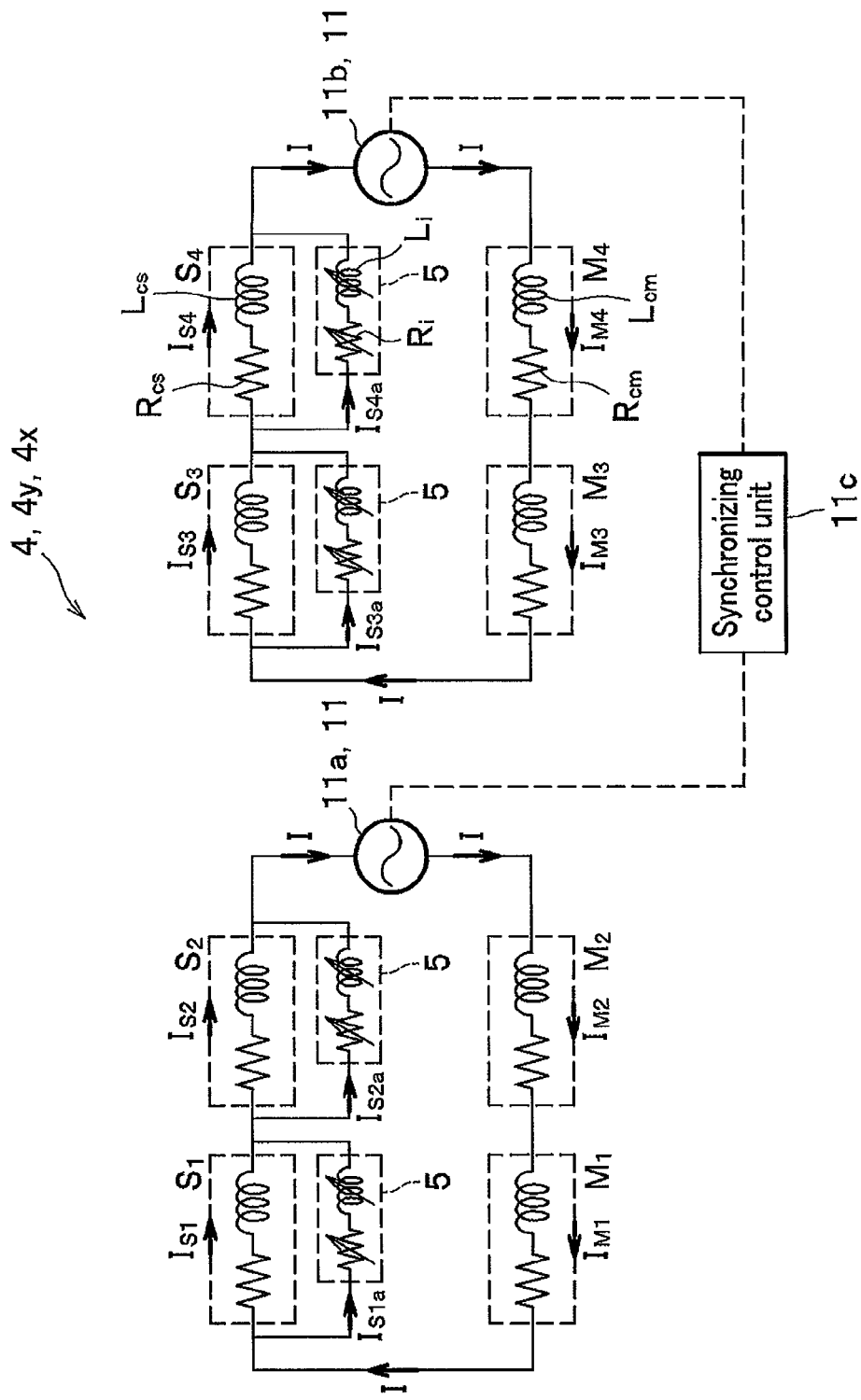
FIG. 10 is an equivalent circuit diagram of a gradient magnetic field coil device (gradient magnetic field coil device generating a gradient magnetic field inclined in the y-axis direction or the x-axis direction) according to a third embodiment of the present invention.

FIG. 10 illustrates an equivalent circuit diagram of a gradient magnetic field coil device 4 (gradient magnetic field coil device 4y generating a gradient magnetic field inclined in the y-axis direction) according to a third embodiment of the present invention. The third embodiment is different from the first embodiment in that a plurality (two in an example in FIG. 10) of a driving power supplies 11a, 11b are used. A part of the plurality (two out of four) of the main coils $M_1$, $M_2$ and a part of the plurality (two out of four) of the shield coils $S_1$, $S_2$ are connected in series and connected to the driving power source (first driving power source) 11a. A plurality (remaining two out of four) of the remaining main coils $M_3$, $M_4$ and a plurality (remaining two out of four) of the remaining shield coils $S_3$, $S_4$ are connected in series and connected to a driving power source (second driving power source) 11b synchronizing with the driving power source 11a by a synchronizing control unit 11c. Because the two driving power supplies 11a, 11b drive the main coil 4a of which the number is the same as that in first embodiment and the shield coils 4b of which the number is the same as that in first embodiment, so that a larger current can be supplied in a short period. In the third embodiment, the one driving power source 11a (11b) is used for the two main coils $M_1$, $M_2$ ($M_3$, $M_4$) and the shield coils $S_1$, $S_2$ ($S_3$, $S_4$). The configuration is not limited to this. For example, it is possible that the driving power source 11a is used for the four main coils $M_1$, $M_2$, $M_3$, $M_4$, and the driving power source 11b is used for the four shield coils $S_1$, $S_2$, $S_3$, $S_4$.

Fourth Embodiment

Figure 11:
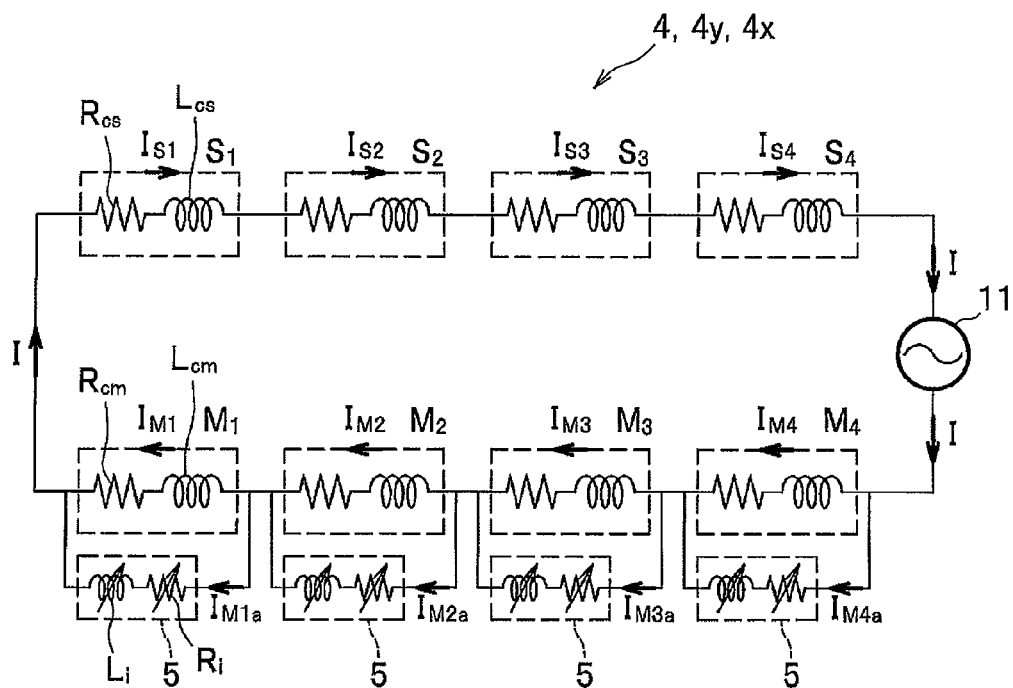
FIG. 11 is an equivalent circuit diagram of a gradient magnetic field coil device (gradient magnetic field coil device generating a gradient magnetic field inclined in the y-axis direction or the x-axis direction) according to a fourth embodiment of the present invention.

FIG. 11 illustrates an equivalent circuit diagram of a gradient magnetic field coil device 4 (gradient magnetic field coil device 4y generating a gradient magnetic field inclined in the y-axis direction) according to a fourth embodiment of the present invention. The fourth embodiment is different from the first embodiment in that the current adjusting devices 5 are connected to the main coils $M_1$, $M_2$, $M_3$, $M_4$ in parallel, respectively. Likewise the first embodiment, maximum values of the resistance component Ri and the inductance component Li are designed for resistance components Rcm and inductance components Lcm of the main coils $M_1$, $M_2$, $M_3$, $M_4$. Currents flowing through the main coils $M_1$, $M_2$, $M_3$, $M_4$ are adjusted independently by varying (adjusting) the resistance components Ri and the inductance components Li of the four current adjusting devices 5 to enhance the symmetry of the residual magnetic field.

Pulsed currents $I_{S1}$, $I_{S2}$, $I_{S3}$, $I_{S4}$ flowing through the four shield coils $S_1$, $S_2$, $S_3$, $S_4$ (4b) become equal to a current I outputted by the drive power source 11 ($I_{S1}=I_{S2}=I_{S3}=I_{S4}=I$). On the other hand, because the current adjusting devices 5 are connected to the four main coils $M_1$, $M_2$, $M_3$, $M_4$ (4a) in parallel, respectively, currents $I_{M1a}$, $I_{M1a}$, $I_{M1a}$, $I_{M1a}$, which is parts of the current I outputted by the drive power source 11 can be branched into the current adjusting devices 5, Pulsed currents current $I_{M1}$, $I_{M2}$, $I_{M3}$, $I_{M4}$ flowing through the main coils $M_1$, $M_2$, $M_3$, $M_4$ (4a) can be adjusted to be differentiated from each other ($I_{M1} \neq I_{M2} \neq I_{M3} \neq I_{M4}$). Further, it is possible to differentiate the Pulsed currents $I_{M1}$, $I_{M2}$, $I_{M3}$, $I_{M4}$ from the current I ($I_{M1}$, $I_{M2}$, $I_{M3}$, $I_{M4} \neq I$).

In addition, it is possible that the current adjusting devices 5 are connected to all the main coils 4a and the shield coils 4b by combining the first embodiment with the fourth embodiment. Further, it is possible that the current adjusting device 5 is connected in parallel to either of the main coils 4a ($M_1$, $M_2$, $M_3$, $M_4$) or the shield coils 4b ($S_1$, $S_2$, $S_3$, $S_4$) which form a pair of members bonded to be overlapped each other. The special example can be considered as the fourth embodiment and the first embodiment. The concept of these modifications can be applied to the second and third embodiments.

Fifth Embodiment

Figure 12:
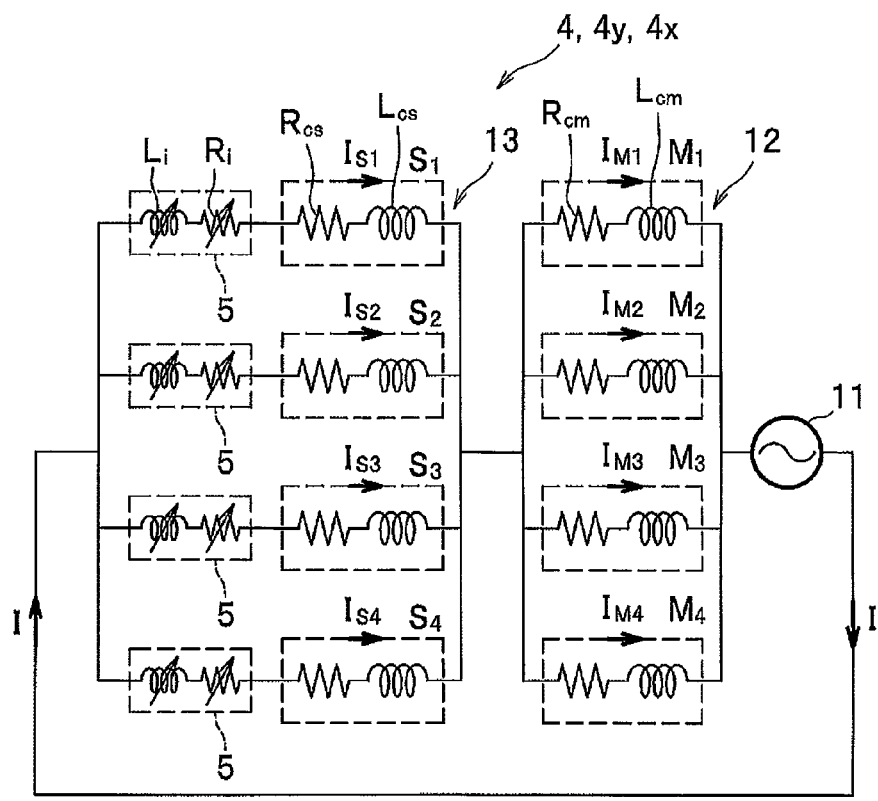
FIG. 12 is an equivalent circuit diagram of a gradient magnetic field coil device (gradient magnetic field coil device generating a gradient magnetic field inclined in the y-axis direction or the x-axis direction) according to a fifth embodiment of the present invention.

FIG. 12 illustrates an equivalent circuit diagram of a gradient magnetic field coil device 4 (gradient magnetic field coil device 4y generating a gradient magnetic field inclined in the y-axis direction) according to a fifth embodiment of the present invention. The fifth embodiment is different from the first embodiment in that the fifth embodiment includes a first parallel circuit 12 in which a plurality (four in the example in FIG. 12) of the main coils $M_1$, $M_2$, $M_3$, $M_4$ (4a) are connected in parallel and a second parallel circuit 13 in which a plurality (four in the example in FIG. 12) of the shield coils $S_1$, $S_2$, $S_3$, $S_4$(4b) are connected in parallel. The first parallel circuit 12 and the second parallel circuit 13 are connected in series. Each of the shield coils $S_1$, $S_2$, $S_3$, $S_4$ (4b) is connected to the current adjusting device 5. The current adjusting device 5 independently adjust the currents $I_{S1}$, $I_{S2}$, $I_{S3}$, $I_{S4}I_{S1}$ flowing through the shield coils $S_1$, $S_2$, $S_3$, $S_4$ (4b) connected in series, respectively to enhance the symmetry of the residual magnetic field.

The Pulsed currents $I_{M1}$, $I_{M2}$, $I_{M3}$, $I_{M4}$ flowing through the four main coils $M_1 M_2$, $M_3$, $M_4$(4a) are equal to each other and equal to one fourth of the current I outputted by the drive power source 11 ($I_{M1}=I_{M2}=I_{M3}=I_{M4}=I/4$).

On the other hand, because the current adjusting devices 5 are connected to the four the shield coils $S_1$, $S_2$, $S_3$, $S_4$ (4a) in series, respectively. Pulsed currents current $I_{S1}$, $I_{S2}$, $I_{S3}$, $I_{S4}$ flowing through the shield coils $S_1$, $S_2$, $S_3$, $S_4$ (4a) can be adjusted to be differentiated from each other ($I_{S1} \neq I_{S2} \neq I_{S3} \neq I_{S4}$). However, a sum of the Pulsed currents $I_{S1}$, $I_{S2}$, $I_{S3}$, $I_{S4}$ is equal to the current I similar to the Pulsed currents $I_{M1}$, $I_{M2}$, $I_{M3}$, $I_{M4}$ ($I_{S1}+I_{S2}+I_{S3}+I_{S4}=I_{M1}+I_{M2}+I_{M3}+I_{M4}=I$).

Because the current adjusting devices 5 and the shield coils $S_1$, $S_2$, $S_3$, $S_4$ (4a) are connected in series, respectively, the resistance value of the resistance component Ri of the current adjusting device 5 is about 1% of the resistance component Rcs of the shield coils $S_1$, $S_2$, $S_3$, $S_4$ (4a), i.e., a value equal to or smaller than 1 milliohm. The inductance component Li of the current adjusting device 5 is also about 1% of the inductance component Lcs of the shield coils $S_1$, $S_2$, $S_3$, $S_4$ (4a), i.e., a value about several μH. In the case of the second parallel circuit 13, because a current having a value equal to or greater than the current $I_{S1}$, $I_{S2}$, $I_{S3}$, $I_{S4}$ of the shield coils $S_1$, $S_2$, $S_3$, $S_4$ (4a) flows, the variable inductor 5b (see FIG. 8) is not always necessary. In the case of the second parallel circuit 13, a heating value at the variable resistor 5a (see FIG. 8) is equal to or smaller than 1% of a total heating value of the shield coils $S_1$, $S_2$, $S_3$, $S_4$(4a).

In the fifth embodiment, the example in which the current adjusting devices 5 are connected to the shield coils $S_1$, $S_2$, $S_3$, $S_4$ (4a) in series, respectively. The configuration is not limited to this. The current adjusting device 5 may be connected to the main coils $M_1$, $M_2$, $M_3$, $M_4$ (4a) in series. In addition, the current adjusting device 5 may be connected to both the main coils $M_1$, $M_2$, $M_3$, $M_4$ (4a) and the shield coil $S_1$, $S_2$, $S_3$, $S_4$ (4a). Further, there is a case where the current adjusting device 5 is connected in series to either of the main coil 4a ($M_1$, $M_2$, $M_3$, $M_4$) or the shield coil 4b($S_1$, $S_2$, $S_3$, $S_4$) which are bonded to be overlapped each other.

In addition, there may be a case where a configuration may include a first parallel circuit 12 and a second parallel circuit 13, the first parallel circuit 12 including two serial connections connected in parallel, one of the serial connections including two out of four coils, for example, the main coils $M_1$ and $M_2$ being connected in series, the other of the serial connections including remaining two out of the four coils, for example, the main coils $M_3$, $M_4$ being connected in series, the second parallel circuit 13 including these two serial connections are connected in parallel, one of the serial connections including two out of four coils, for example, the shield coils $S_1$ and $S_2$ being connected in series, the other of the serial connections including remaining two out of the four coils, for example, the shield coils $S_3$, $S_4$ are connected in series. The first parallel circuit 12 and the second parallel circuit 13 are connected in series. In this case, one current adjusting device 5 is connected to the serial connection of the main coils $M_1$, $M_2$ in series, one current adjusting device 5 is connected to the serial connection of the main coils $M_3$, $M_4$ in series, one current adjusting device 5 is connected to the serial connection of the shield coils $S_1$, $S_2$ in series, and one current adjusting device 5 is connected to the serial connection of the shield coils $S_3$, $S_4$ in series.

Sixth Embodiment

Figure 13:
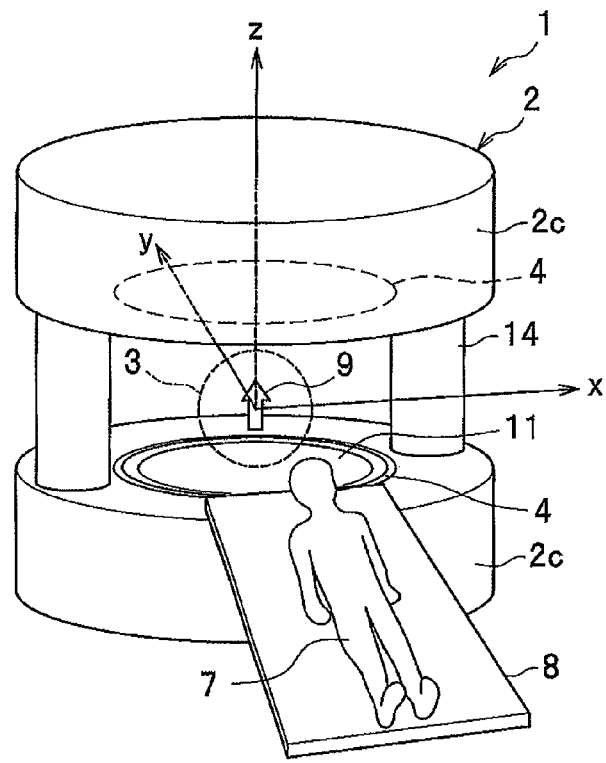
FIG. 13 is a perspective view of the MRI (magnetic resonance imaging) apparatus including a gradient magnetic field coil device according to a sixth embodiment of the present invention.

FIG. 13 is a perspective view of the MRI (magnetic resonance imaging) apparatus including a gradient magnetic field coil device 4 according to a sixth embodiment of the present invention. The sixth embodiment is different from the first embodiment in that the MRI apparatus 1 is changed from a horizontal magnetic field type to a vertical magnetic field type. In the sixth embodiment, upper and lower disk-shape vacuum vessels 2c (magnet device 2) are connected with supporting legs 14, and in the imaging region 3 between the vacuum vessels 2c (the magnet devices 2), the static magnetic field 9 is generated in the vertical direction. In the sixth embodiment, the gradient magnetic field coil device 4 and the RF coil 6 are formed in disk shapes. The main coil 4a (first coil) configured in the gradient magnetic field coil device 4 is also formed in a disk shape. The shield coil (second coil) 4b configured in the gradient magnetic field coil device 4 is also formed in a disk shape, but may be formed in a circular cone shape or a circular truncated cone shape. The object body (patient) 7 lying on the moving bed 8 is introduced into the imaging region 3 between the upper and lower the vacuum vessels 2c (the magnet device 2), and a tomographic image is photographed. Center axes of triple disk shapes of the vacuum vessels 2c, the gradient magnetic field coil device 4, and the RF coil 6 approximately agree and set in the vertical direction. To make later described explanation easier, the z axis is set so as to agree with the center axes, and y axis is set in the horizontal direction. The x axis is also set in the horizontal direction. The origin of the coordinates is set at a symmetric point of point symmetry of a pair of the vacuum vessels 2c.

Figure 14:
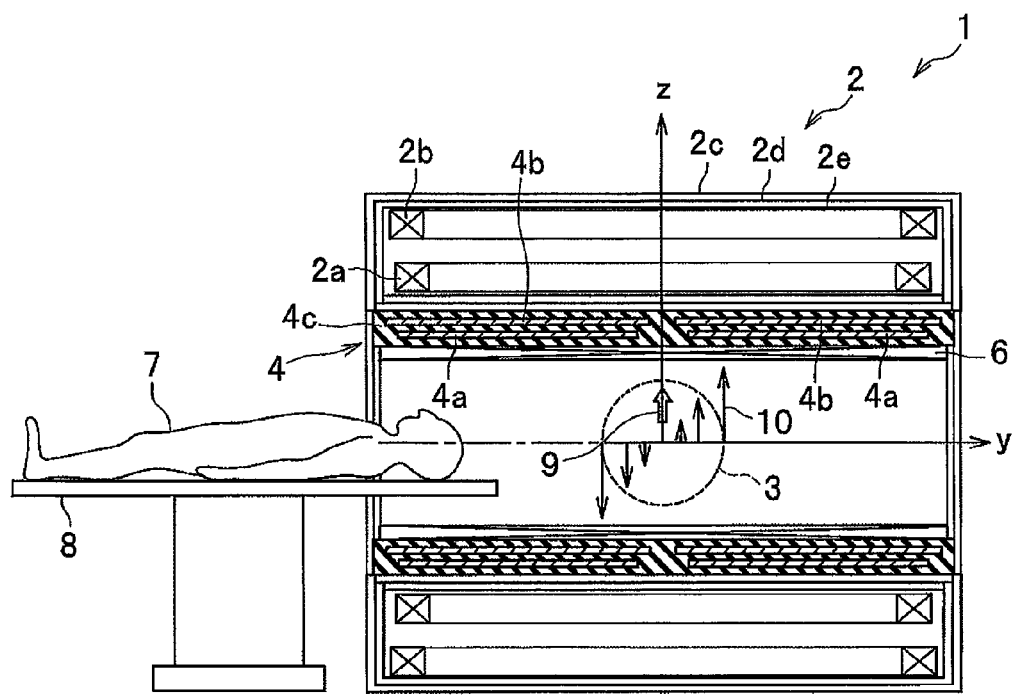
FIG. 14 is a cross section view of the MRI (magnetic resonance imaging) apparatus according to the sixth embodiment of the present invention, including a gradient magnetic field coil device, cut away on a plane which is in parallel to the y axis and the z axis.

FIG. 14 illustrates a cross section view of the MRI apparatus according to the sixth embodiment of the present invention, including a gradient magnetic field coil device 4, cut away on a plane which is in parallel to the y axis and the z axis. The magnet device 2 is provided with the main coils (superconducting coils) 2a generating the static magnetic field 9 in the imaging region 3 and the shield coil (superconducting coils) 2b suppressing leak of the static magnetic field 9 (residual magnetic field) to a periphery. The main coils 2a, 2b have ring shapes having a common axis on the z axis.

The gradient magnetic field coil device 4 generates gradient magnetic fields in the imaging region 3. The gradient magnetic field coil device 4 includes a plurality of main coils (first coils) 4a generating magnetic field distributions in which an intensity is inclined linearly in the imaging region 3, and a plurality of shield coils (second coils) 4b, arranged on an opposite side of the imaging region 3 across the main coil 4a, to suppress the residual magnetic field generated by the main coil 4a on the opposite side of the imaging region 3. A gap between the main coil 4a and the shield coil 4b is filled with the resin 4c which is hardened to fix the main coil 4a and the shield coil 4b. The gradient magnetic field is magnetic fields having magnetic flux densities in the same direction as the static magnetic field 9 has are linearly inclined in three direction, i.e., x axis, y axis, and z axis, the magnetic field being repeatedly, serially generated in a manner of time deviation in x-, y-, and z-axis directions as pulses. More specifically, FIG. 14 shows the gradient magnetic field 10 of which intensity is linearly inclined in the y-axis direction.

Figure 15:
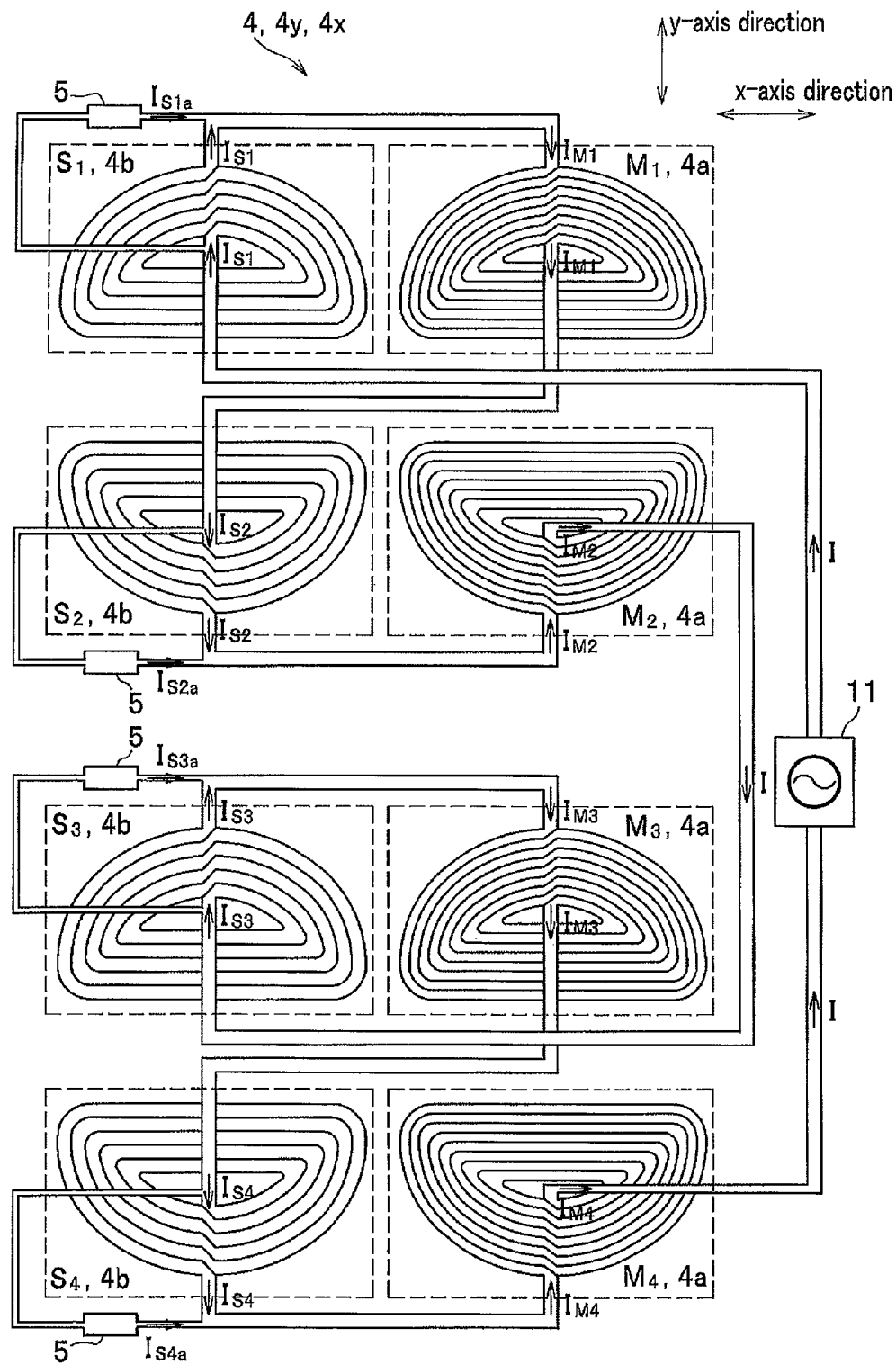
FIG. 15 is a developed view of a lamination structure of the main and shield coils of the gradient magnetic field coil device (gradient magnetic field coil device generating a gradient magnetic field inclined in a y-axis or an x-axis direction) according to the sixth embodiment of the invention.

FIG. 15 shows a developed view of a developed lamination structure of the main coils 4a and shield coils 4b of the gradient magnetic field coil device 4 (gradient magnetic field coil device 4y generating a gradient magnetic field inclined in a y-axis) according to the sixth embodiment of the invention. Before development, the shield coil $S_1$ (4b) and a main coil $M_1$ (4a) are laminated so that the shield coil $S_1$(4b) is arranged in parallel to and on an outside of the main coil $M_1$ (4a). The shield coil $S_2$ (4b) and the main coil $M_2$ (4a) are laminated so that the shield coil $S_2$ (4b) is arranged in parallel to and on an outside of the main coil $M_2$ (4a). The shield coil $S_3$ (4b) and the main coil $M_3$ (4a) are laminated so that the shield coil $S_3$ is arranged in parallel to and on an outside of the main coil $M_3$ (4a). The shield coil $S_4$ (4b) and the main coil $M_4$ (4a) are laminated so that the shield coil $S_4$ is arranged in parallel to and on an outside of the main coil $M_4$ (4a).

As shown in FIG. 15, the current adjusting devices 5 are connected to the shield coils 4b ($S_1$, $S_2$, $S_3$, $S_4$) having spiral shapes, respectively. One end of the current adjusting device 5 is connected to an inside of each shield coil 4b ($S_1$, $S_2$, $S_3$, $S_4$) having the spiral shape and the other end is connected to an outside of each shield coil 4b having the spiral shape. The current adjusting device 5 is connected to each shield coil 4b ($S_1$, $S_2$, $S_3$, $S_4$) in parallel.

Causing a Pulsed current $I_{S1a}$ to flow through the current adjusting device 5 connected to the shield coil 4b ($S_1$) in parallel can adjust the Pulsed current $I_{S1}$ flowing through the shield coil 4b ($S_1$). Causing a Pulsed current $I_{S2a}$ to flow through the current adjusting device 5 connected to the shield coil 4b ($S_2$) in parallel can adjust the Pulsed current $I_{S2}$ flowing through the shield coil 4b ($S_2$). Causing a Pulsed current $I_{S3a}$ to flow through the current adjusting device 5 connected to the shield coil 4b ($S_3$) in parallel can adjust the Pulsed current $I_{S3}$ flowing through the shield coil 4b ($S_3$). Causing a Pulsed current $I_{S4a}$ to flow through the current adjusting device 5 connected to the shield coil 4b ($S_4$) in parallel can adjust the Pulsed current $I_{S4}$ flowing through the shield coil 4b ($S_4$).

Figure 18:
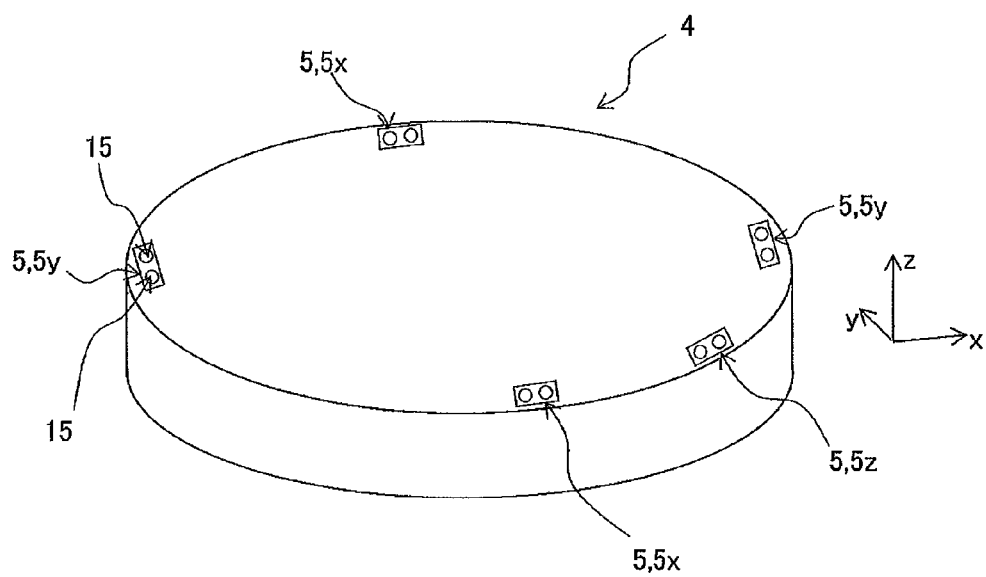
FIG. 18 is a perspective view of the gradient magnetic field coil device according to the sixth embodiment of the present invention.

FIG. 18 shows an example in mode in which it is easy to adjust the current adjusting device 5 in the vertical magnetic field type of the MRI apparatus 1 (see FIG. 13) from an outside of the gradient magnetic field coil device 4. When the current adjusting device 5 is adjusted after the gradient magnetic field coil device 4 is combined with the magnet device 2 likewise the horizontal magnetic field type of MRI apparatus 1 according to the first embodiment, if the current adjusting device 5 is installed at an end in a diametrical direction of the gradient magnetic field coil device 4 or on a surface on the side of the imaging region 3, the adjustment operation becomes easy. FIG. 18 shows an installation state of the current adjusting device 5 relative to the lower part of a pair of upper and lower gradient magnetic field coil devices 4. The gradient magnetic field coil device 4 on the upper side is the same as the gradient magnetic field coil device 4 on the lower side in FIG. 18 shown upside down. In the second embodiment, it is desirable to install the current adjusting device 5x for the gradient magnetic field coil device 4x for the x-axis direction is installed at an end in the y-axis direction and an end in the z-axis direction (a surface on the imaging region 3 side). Further, it is desirable to install the current adjusting device 5y for the gradient magnetic field coil device 4y for the y-axis direction is installed at an end in the x-axis direction and an end in the z-axis direction (a surface on the imaging region 3 side). According to these, it is possible to install the current adjusting devices 5x, 5y, 5z between the main coils 4a forming the gradient magnetic field coil devices 4x, 4y in x- and y-axes direction or between the shield coils 4b. Further, installation can be made without narrowing the spaces for the gradient magnetic field 10 and the object body 7, and the operator, etc., can adjust the entire current adjusting device 5 with trimming knobs or terminals 15 from an outside. In FIG. 18, the current adjusting device 5z for the gradient magnetic field 4z for the z-axis direction is installed at an end in the z-axis direction (surface on the imaging region 3 side) and between the current adjusting devices 5x and 5y in circumferential direction. Further, the configuration is not limited to this. The current adjusting device 5z may be installed near the current adjusting device 5x or 5y between the main coils 4a forming the gradient magnetic field coil devices 4x, 4y in x- and y-axes direction or between a shield coils 4b.

DESCRIPTION OF REFERENCE SYMBOLS

1 MRI (magnetic field resonance imaging) apparatus
2 magnet device
2a superconducting coil (shield coil)
2b superconducting coil (shield coil)
2c vacuum vessel
2d radiation shield
2e refrigerant vessel
3 imaging region
4 gradient magnetic field coil device
4a, $M_1$, $M_2$, $M_3$, $M_4$ main coil (first coil)
4b, $S_1$, $S_2$, $S_3$, $S_4$ shield coil (second coil)
4c resin
4y gradient magnetic field coil device generating gradient magnetic field inclined in y-axis direction
4x gradient magnetic field coil device generating gradient magnetic field inclined in x-axis direction
4z gradient magnetic field coil generating gradient magnetic field inclined in z-axis direction
5 current adjusting device
5a variable resistor
5b variable inductor
5c tap switch terminal
5x current adjusting device for x-axis gradient magnetic field coil device
5y current adjusting device for y-axis gradient magnetic field coil device
5z current adjusting device for z-axis gradient magnetic field coil device
6 RF coil
7 object body (patient)
8 moving bed
9 static magnetic field (direction)
10 gradient magnetic field inclined in the y-axis direction
11 drive power source
11a drive power source (first drive power source)
11b drive power source (second drive power source)
11c synchronizing device
12 first parallel circuit 13 second parallel circuit
14 supporting leg
15 knob or terminal
P1 to P6, Q1 to Q8 magnetic field measuring point
Rcm resistance component of main coil (first coil)
Rcs resistance component of shield coil (second coil)
Ri resistance component of current adjusting device
Lcm inductance component of main coil (first coil)
Lcs inductance component of shield coil (second coil)
Li inductance component of current adjusting device

The invention claimed is:

1. A gradient magnetic field coil device comprising:
a plurality of first coils each of which generates in an imaging region of a magnetic field resonance imaging device a magnetic field distribution in which an intensity linearly increases in a predetermined direction; and
a plurality of second coils each of which is arranged on an opposite side of the imaging region across the first coils and suppresses residual magnetic field generated on the opposite side by the first coil, wherein
the plurality of first coils and the plurality of second coils are connected in series, the gradient magnetic field coil device further comprising
a plurality of current adjusting devices, connected to either of the first coils or the second coils in parallel, independently adjusting currents flowing through the first coils or the second coils, respectively,
wherein the plurality of first coils and the plurality of second coils are connected in series by alternately connecting a member from the first coils and a member from the second coils.

2. The gradient magnetic field coil device as claimed in claim 1, wherein
the plurality of current adjusting devices includes first and second driving sources, a part of the plurality of first coils and a part of the plurality of second coils being connected in series and connected to the first driving power source, and
a remaining part of the plurality of first coils and a remaining part of the plurality of second coils are connected in series and connected to the second driving power source which is synchronous with the first driving power source.

3. The gradient magnetic field coil device as claimed in claim 1, wherein the current adjusting device is disposed at one end of the gradient magnetic field coil device in the predetermined direction in which the intensity linearly increases or a direction orthogonal with the predetermined direction.

4. The gradient magnetic field coil device as claimed in claim 1, wherein the current adjusting device adjusts a value of a current flowing through the first coil or the second coil so as to enhance symmetry of the residual magnetic field.

5. The gradient magnetic field coil device as claimed in claim 1, wherein the current adjusting device adjusts currents so as to make a direction and an intensity of the residual magnetic field distribution in plane symmetry with respect to a plane passing a center of the imaging region or point symmetry with respect to a center of the imaging region.

6. The gradient magnetic field coil device as claimed in claim 1, further comprising a magnet device, generating a static magnetic field, arranged on an opposite side of the imaging region across the second coil.

7. A gradient magnetic field coil device, comprising:
a plurality of first coils each of which generates in an imaging region of a magnetic field resonance imaging device a magnetic field distribution in which an intensity linearly increases in a predetermined direction; and
a plurality of second coils each of which is arranged on an opposite side of the imaging region across the first coils and suppresses residual magnetic field generated on the opposite side by the first coil, wherein
the plurality of first coils and the plurality of second coils are connected in series, the gradient magnetic field coil device further comprising
a plurality of current adjusting devices, connected to either of the first coils or the second coils in parallel, independently adjusting currents flowing through the first coils or the second coils, respectively,
wherein the plurality of first coils and the plurality of second coils are connected in series by alternately connecting a member from the first coils and a member from the second coils,
wherein the current adjusting device includes a variable resistor and a variable inductor as a variable impedance element, and wherein
a ratio of resistance components between either one of the first coil or the second coil and the current adjusting device is substantially equal to a ratio of inductance components between the either one of the first coil or the second coil and the current adjusting device.

8. The gradient magnetic field coil device as claimed in claim 7, wherein
the plurality of current adjusting devices includes first and second driving sources, a part of the plurality of first coils and a part of the plurality of second coils being connected in series and connected to the first driving power source, and
a remaining part of the plurality of first coils and a remaining part of the plurality of second coils are connected in series and connected to the second driving power source which is synchronous with the first driving power source.

9. The gradient magnetic field coil device as claimed in claim 7, wherein the current adjusting device is disposed at one end of the gradient magnetic field coil device in the predetermined direction in which the intensity linearly increases or a direction being orthogonal with the predetermined direction.

10. The gradient magnetic field coil device as claimed in claim 7, wherein the current adjusting device adjusts a value of a current flowing through the first coil or the second coil so as to enhance symmetry of the residual magnetic field.

11. The gradient magnetic field coil device as claimed in claim 7, wherein the current adjusting device adjusts currents so as to make a direction and an intensity of the residual magnetic field distribution in plane symmetry with respect to a plane passing a center of the imaging region or point symmetry with respect to a center of the imaging region.

12. The gradient magnetic field coil device as claimed in claim 7, further comprising a magnet device, generating a static magnetic field, arranged on an opposite side of the imaging region across the second coil.

13. A gradient magnetic field coil device comprising:
a plurality of first coils each of which generates in an imaging region of a magnetic field resonance imaging device a magnetic field distribution in which an intensity linearly increases in a predetermined direction; and
a plurality of second coils each of which is arranged on an opposite side of the imaging region across the first coils and suppresses residual magnetic field generated on the opposite side by the first coil, wherein the plurality of first coils and the plurality of second coils are connected in series, the gradient magnetic field coil device further comprising a plurality of current adjusting devices, connected to either of the first coils or the second coils in parallel, independently adjusting currents flowing through the first coils or the second coils, respectively, wherein the plurality of first coils and the plurality of second coils are connected in series by alternately connecting a member from the first coils and a member from the second coils, wherein the current adjusting device includes a variable resistor and a variable inductor as a variable impedance element, and wherein a value of the variable resistor and a value of the variable inductor can be adjusted from an outside.

14. The gradient magnetic field coil device as claimed in claim 13, wherein the plurality of current adjusting devices includes first and second driving sources, a part of the plurality of first coils and a part of the plurality of second coils being connected in series and connected to the first driving power source, and a remaining part of the plurality of first coils and a remaining part of the plurality of second coils are connected in series and connected to the second driving power source which is synchronous with the first driving power source.

15. The gradient magnetic field coil device as claimed in claim 13, wherein the current adjusting device is disposed at one end of the gradient magnetic field coil device in the predetermined direction in which the intensity linearly increases or a direction being orthogonal with the predetermined direction.

16. The gradient magnetic field coil device as claimed in claim 13, wherein the current adjusting device adjusts a value of a current flowing through the first coil or the second coil so as to enhance symmetry of the residual magnetic field.

17. The gradient magnetic field coil device as claimed in claim 13, wherein the current adjusting device adjusts currents so as to make a direction and an intensity of the residual magnetic field distribution in plane symmetry with respect to a plane passing a center of the imaging region or point symmetry with respect to a center of the imaging region.

18. The gradient magnetic field coil device as claimed in claim 13, further comprising a magnet device, generating a static magnetic field, arranged on an opposite side of the imaging region across the second coil.

* * * * *